US012588143B2

(12) United States Patent
Rathburn

(10) Patent No.: US 12,588,143 B2
(45) Date of Patent: Mar. 24, 2026

(54) LIQUID CRYSTAL POLYMER EMBEDDED MICROELECTRONICS DEVICE

(71) Applicant: LCP Medical Technologies, LLC, Rogers, MN (US)

(72) Inventor: James Rathburn, Rogers, MN (US)

( * ) Notice: Subject to any disclaimer, the term of this patent is extended or adjusted under 35 U.S.C. 154(b) by 107 days.

(21) Appl. No.: 18/402,447

(22) Filed: Jan. 2, 2024

(65) Prior Publication Data

US 2024/0147614 A1 May 2, 2024

Related U.S. Application Data

(62) Division of application No. 17/756,021, filed as application No. PCT/US2020/060631 on Nov. 14, 2020, now Pat. No. 11,997,786.

(60) Provisional application No. 62/935,430, filed on Nov. 14, 2019.

(51) Int. Cl.
| | |
|---|---|
| *H05K 3/30* | (2006.01) |
| *H05K 1/02* | (2006.01) |
| *H05K 1/03* | (2006.01) |
| *H05K 1/18* | (2006.01) |

(52) U.S. Cl.
CPC .......... *H05K 1/032* (2013.01); *H05K 1/0296* (2013.01); *H05K 3/30* (2013.01); *H05K 2201/0141* (2013.01)

(58) Field of Classification Search
CPC ... H05K 1/185–188; H05K 1/032; H05K 3/30
See application file for complete search history.

(56) References Cited

U.S. PATENT DOCUMENTS

| | | | |
|---|---|---|---|
| 7,032,608 | B2 | 4/2006 | Koeneman et al. |
| 2006/0035415 | A1 | 2/2006 | Wood et al. |
| 2006/0267176 | A1 | 11/2006 | Offrein et al. |
| 2008/0003493 | A1 | 1/2008 | Bates |
| 2008/0030636 | A1* | 2/2008 | Huang .............. G02F 1/136213 349/38 |
| 2012/0112347 | A1 | 5/2012 | Eckhardt et al. |
| 2016/0238915 | A1 | 8/2016 | Kim et al. |
| 2016/0260685 | A1* | 9/2016 | Tremlett ............... H01L 25/105 |
| 2017/0311029 | A1* | 10/2017 | Jung ................... G06F 3/03547 |

(Continued)

FOREIGN PATENT DOCUMENTS

| | | |
|---|---|---|
| WO | 2012085728 A1 | 6/2012 |
| WO | 2019103732 A1 | 5/2019 |

OTHER PUBLICATIONS

International Search Report and Written Opinion, PCT/US20/60631, issued Apr. 15, 2021, 10 pages.

(Continued)

*Primary Examiner* — Jeremy C Norris
(74) *Attorney, Agent, or Firm* — Carlson, Caspers, Vandenburgh & Lindquist, P.A.

(57) ABSTRACT

Embodiments described herein can include multi-layer circuits within a liquid crystal polymer (LCP) material to define a 3-D interconnect structure that connects the microelectronics features, devices, components and electrical interfaces. In addition, mechanical functions can be embedded in a fashion and proximity such that the embedded electronics can interface and interact with each other as well as introduced conditions relevant to the function of the device and the outside world or environment it is exposed to.

10 Claims, 31 Drawing Sheets

(56) References Cited

U.S. PATENT DOCUMENTS

| | | | |
|---|---|---|---|
| 2018/0061869 A1* | 3/2018 | Suzuki | .............. G02F 1/136286 |
| 2018/0124928 A1 | 5/2018 | Rathburn | |

OTHER PUBLICATIONS

United States Patent and Trademark Office, "Notice of Allowance and Fee(s) Due," U.S. Appl. No. 17/756,021, filed Jan. 22, 2024, 7 pgs.

* cited by examiner

102

Interconnect
Circuitry
106

Printed Circuit
Assembly (PCA)
106

Various Devices - IC,
Passive, Active etc.
106

Optional Overmold,
Housing, Shroud,
External Surface
104

Various Devices - IC,
Passive, Active etc.
106

9 micron
Line and Space
18 micron pitch
210

25 micron
Line and Space
50 micron pitch
208

75 micron
500 micron pitch

206

Embedded Circuit
External Surface

Embedded Circuit
3D Conformal

Embedded Circuit
Over Molded

Embedded Circuit
Internal Surface

Wire Bond Pad to Pad

Stud Bump Thermo Compression Bond to Bump

Stud Bump Thermo Compression Bond to Pad

Solder Bumped Flip Chip Reflow to Copper Pillar

Solder Bumped Flip Chip Reflow to Die Bond Pad

Embedded die bond pads plated with electrolyte copper to stimulate a buried via

Embedded die with mask, side walls and die bond pads plated with electroless copper

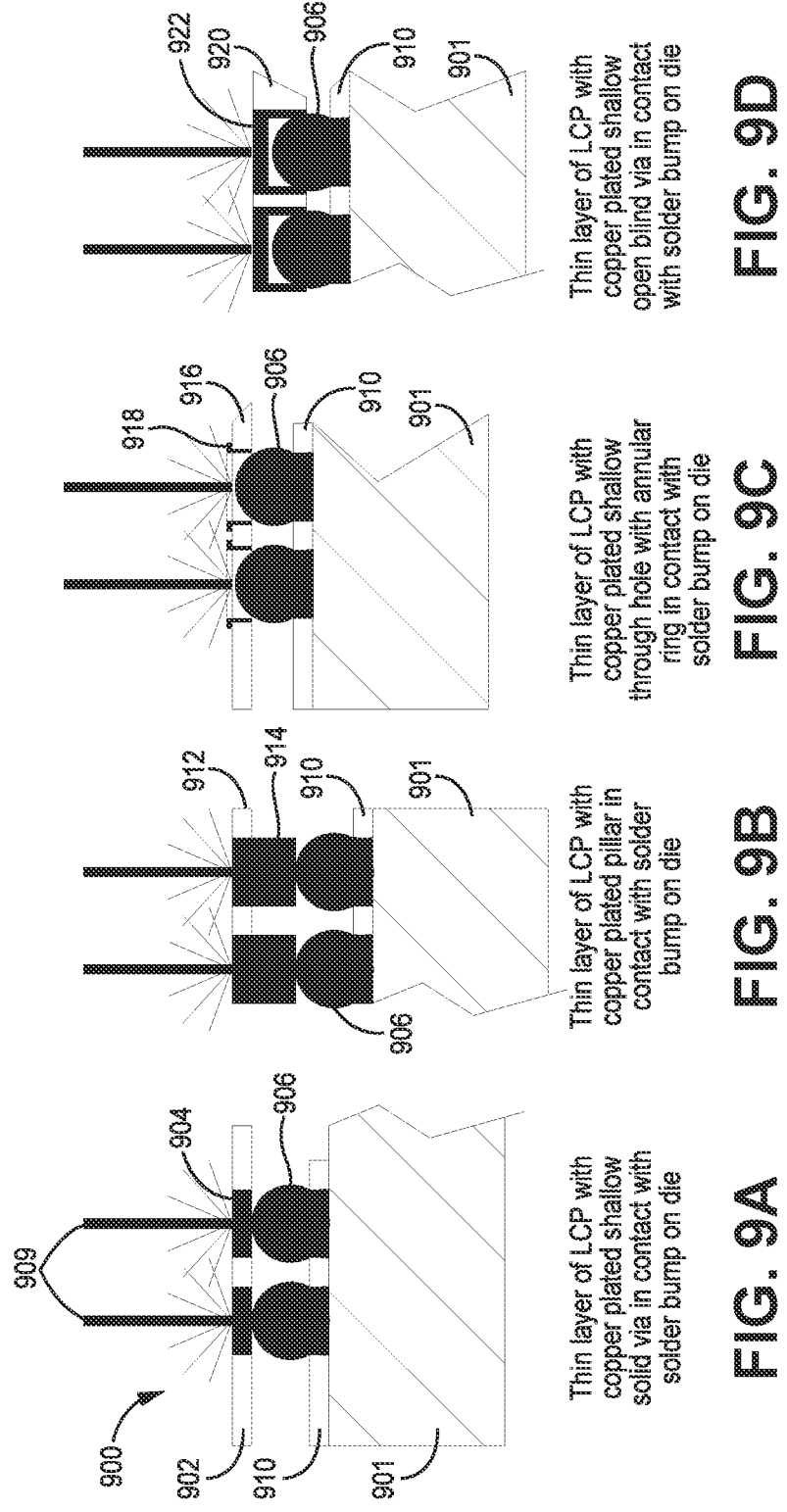

Thin layer of LCP with copper plated shallow solid via in contact with solder bump on die

FIG. 9A

Thin layer of LCP with copper plated pillar in contact with solder bump on die

FIG. 9B

Thin layer of LCP with copper plated shallow through hole with annular ring in contact with solder bump on die

FIG. 9C

Thin layer of LCP with copper plated shallow open blind via in contact with solder bump on die

FIG. 9D

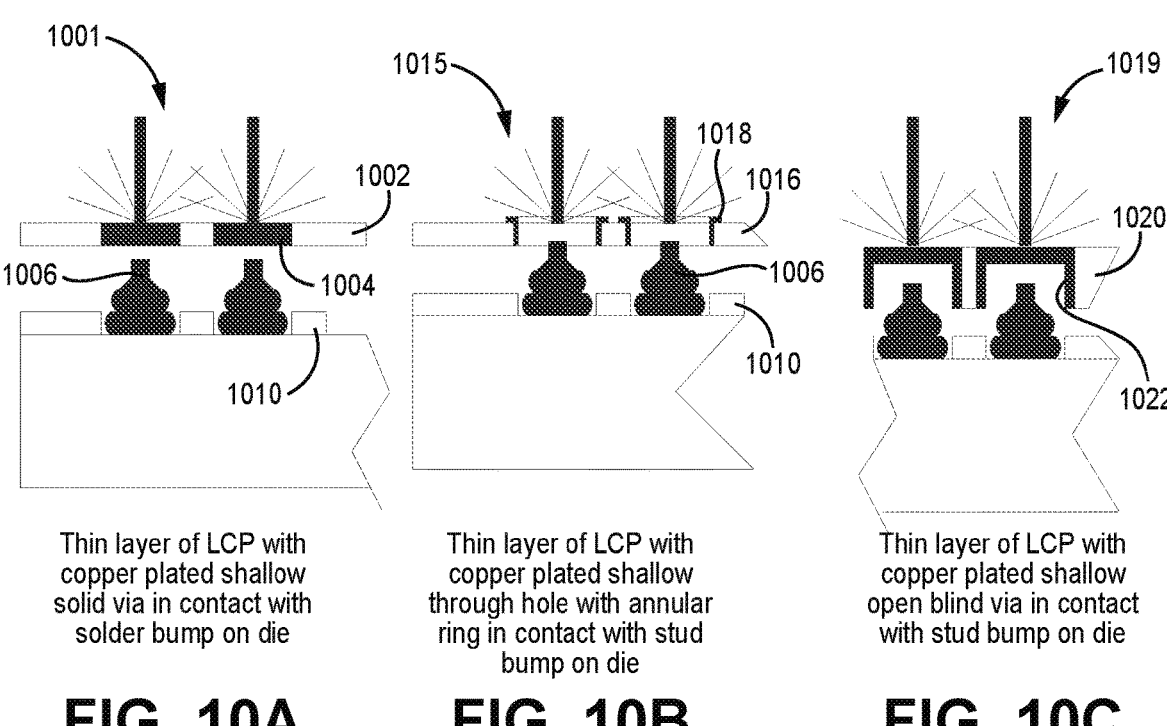

Thin layer of LCP with copper plated shallow solid via in contact with solder bump on die

FIG. 10A

Thin layer of LCP with copper plated shallow through hole with annular ring in contact with stud bump on die

FIG. 10B

Thin layer of LCP with copper plated shallow open blind via in contact with stud bump on die

FIG. 10C

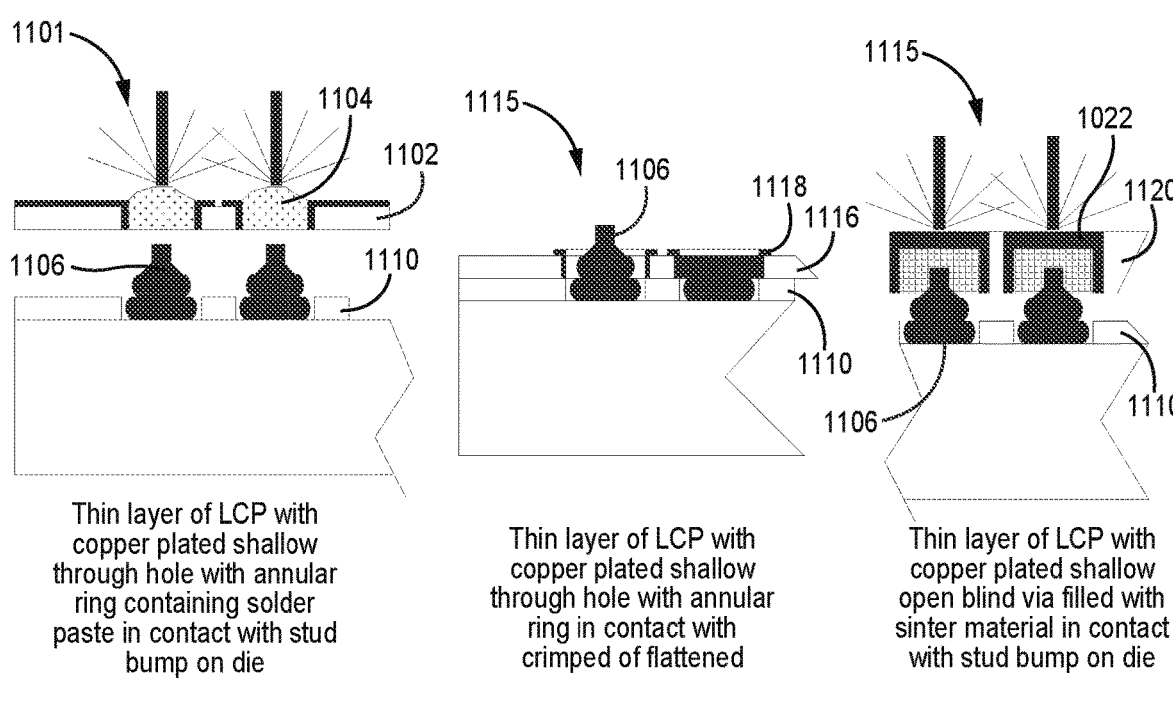

Thin layer of LCP with copper plated shallow through hole with annular ring containing solder paste in contact with stud bump on die

FIG. 11A

Thin layer of LCP with copper plated shallow through hole with annular ring in contact with crimped of flattened

FIG. 11B

Thin layer of LCP with copper plated shallow open blind via filled with sinter material in contact with stud bump on die

FIG. 11C

Passive Components assembled to circuit with similar process to die attached

Circuit bearing assembled die

Packaged Components assembled to circuit with similar process to die attached

Through Hole Pattern

LCP

1300

LCP Overmold or Removable Temporary Overmold-Mask

1300

Base copper layer 1302

Pre-Assembled printed circuit sub-assembly

Circuit layers added to sub-assembly

Stud bumps at via locations 1312

Collapsed Stud Bump

Single or Multiple Sensor die

Embedded Lens, Embedded Light Pipe, Embedded Fluidic channel options

LED Die

Embedded Thermal Management

1402

1404
1408
1406

1404
1406

1408

1402

1409

1410

— Electric Metal Layer 1412
— Printed Battery Materials 1416
— Electrode Metal Layer 1414

Embedded RF IC 1502

Embedded Antennae 1504

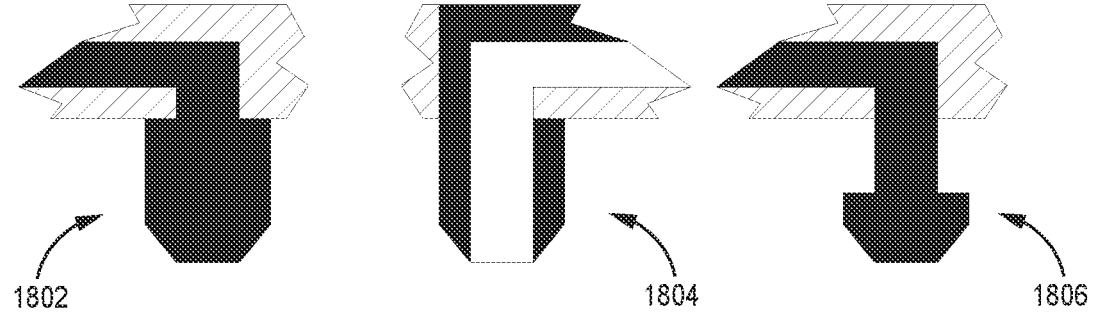
1802               1804               1806
FIG. 18A     FIG. 18B     FIG. 18C
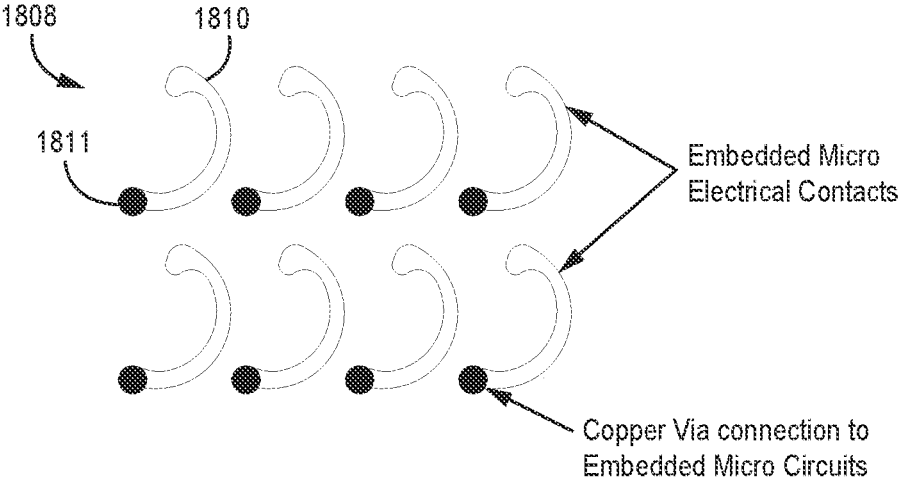
FIG. 19

1808

LIQUID CRYSTAL POLYMER EMBEDDED MICROELECTRONICS DEVICE

RELATED APPLICATIONS

This application is a divisional of U.S. patent application Ser. No. 17/756,021, filed May 13, 2022, which is a 35 U.S.C. § 371 National Phase Entry of PCT/US2020/060631, filed Nov. 14, 2020, which claims the benefit of U.S. Provisional Application No. 62/935,430, filed on Nov. 14, 2019, the disclosures of which are hereby incorporated herein by reference in their entirety.

BACKGROUND

Liquid Crystal Polymer (LCP) is a thermoplastic material that can be used to manufacture multilayer printed circuit boards (PCBs). As in any traditional PCB, PCBs with LCP layers are fabricated and mounted (e.g., using a fastener such as a screw) to or within a housing of a larger device of which the PCB is a part. For example, a PCB with LCP layers can be fabricated and subsequently assembled within a housing of a telecommunications device.

LCP is also widely used for precision injection molding and can be filled or loaded with an endless list of materials to change electrical or mechanical properties. LCP is a very low loss material with a low dielectric constant and when applied to precision circuit fabrication techniques can support very high-density circuitry that can also be very high performance for high speed or wireless applications. LCP is also impervious to moisture, chemically resistant, near hermetic, and biocompatible. As a thermoplastic, LCP can be formed, shaped, reflowed, fusion bonded, laser ablated, plasma etched, metal plated, sputtered, heat staked etc. along with a large variety of manufacturing methods.

BRIEF DESCRIPTION

Embodiments described herein can include multi-layer circuits within a liquid crystal polymer (LCP) material to define a 3-D interconnect structure that connects the micro-electronics features, devices, components and electrical interfaces. In addition, mechanical functions can be embedded in a fashion and proximity such that the embedded electronics can interface and interact with each other as well as introduced conditions relevant to the function of the device and the outside world or environment it is exposed to.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, in which:

FIGS. 9A-D are cross-sectional views of example processes of fusing additional layers of LCP with embedded conductive lines (among other things) to bond pads of a die;

FIGS. 10A-10C are cross-sectional views of example processes and structures for fusing additional layers of LCP to an IC having stud bumps on a bond pad thereof;

FIGS. 11A-11D are cross-sectional views of other example processes and structures for fusing additional layers of LCP to an IC having stud bumps on a bond pad thereof;

FIGS. 12A-I are cross-sectional views of an example process for fabricating an interposer that is composed of a thin layer of LCP with copper vias extending therethrough as described above;

FIG. 18A-C are cross-sectional views of example electrical terminations that can facilitate electrical connection to next level assembly, or provide micro-electrodes to interface to a desired surface;

FIG. 19 is a cross-sectional view of example metal portions of a plurality of micro-contacts that can be formed in LCP material;

DETAILED DESCRIPTION

Figure 1:
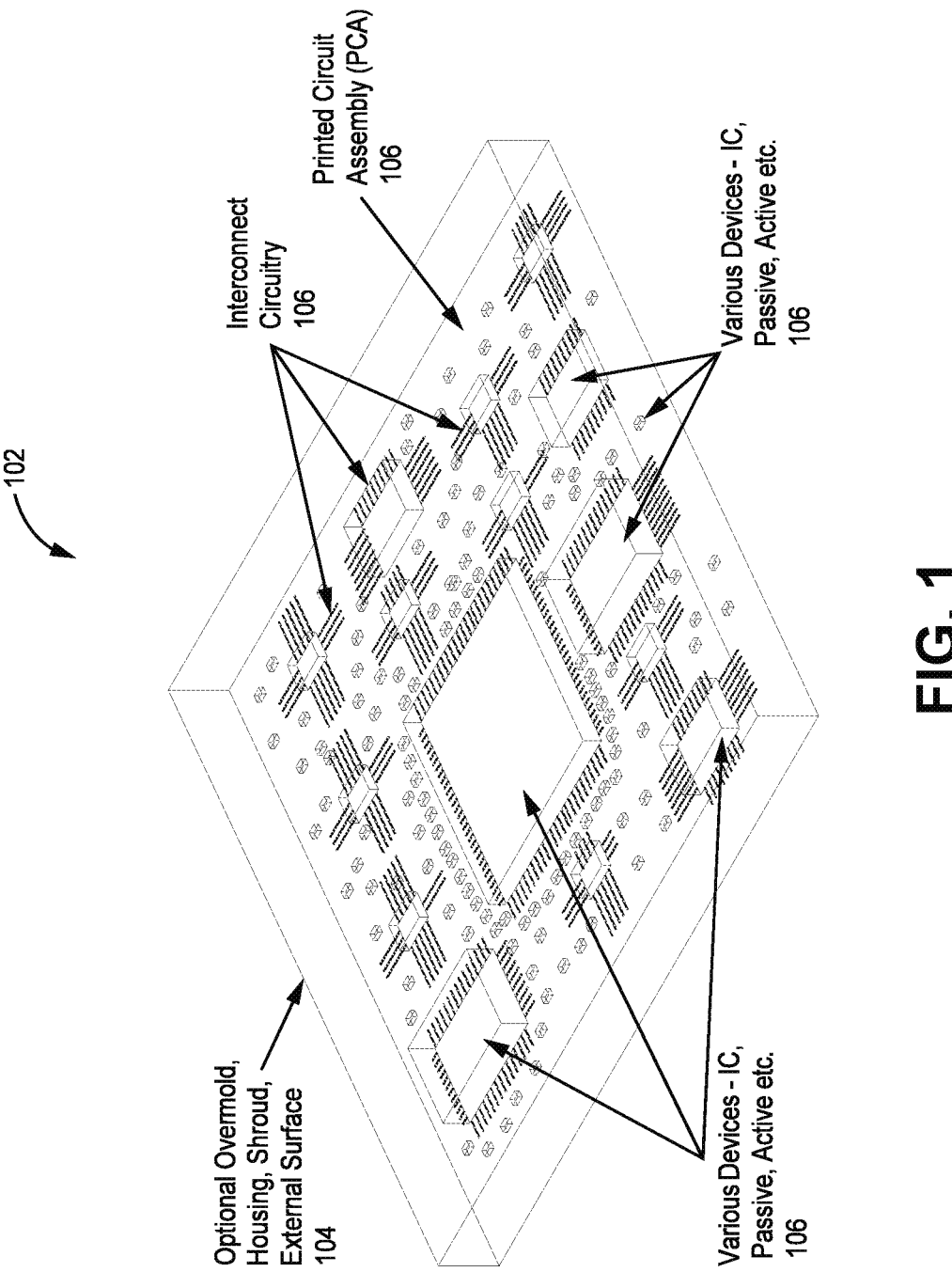
FIG. 1 is a is a see-through perspective view of an example LCP structure including LCP material having circuit components and other function features embedded or defined therein.

Semiconductor and microelectronics devices are used widespread across all industries in today's electronics industries. The majority of conventional usage methods consist of groups of packaged devices arranged and assembled to a variety of printed circuits using surface mount soldering technology as the normal process. The semiconductor packages themselves contain semiconductor die which have a much finer terminal pitch than the available printed circuit assemblies and provide a terminal pitch fan out or redistribution to enable mounting to the printed circuit. The semiconductor packaging also provides some level of protection of the internal die, and in some cases multiple die or passive devices are assembled into the package to construct what is often called a system in package. In some cases the semiconductor die are mounted directly to the printed circuit but this is usually limited to very small devices with low pin count. In recent years, chipscale or fan out packages have entered the mobile marketplace primarily for size and performance reasons, and these devices often do not have a secondary overmold or package protection and can be similar in size to the bare die. In general, the printed circuit assembly with components assembled are subsequently assembled into the end product device or end product system. Demanding on the complexity of the end product, multiple printed circuit assemblies as well as other related components and assemblies are arranged and interconnected to create the final product or system.

The printed circuit industry capabilities for terminal pitch and circuit line and space measured in microns are generally 2 orders of magnitude or more larger feature size than the semiconductor industry which measures in nanometers or sub nanometer. The semiconductor packaging industry creates an interposer or pitch transition substrate which typically bridges the gap between the features on the semiconductor and the resulting interconnect locations on the printed circuit assembly that eventually ends up in the final product or system. The physical size requirements for this interface are often target for refinement and shrinkage as systems and end products strive for smaller form factors and increases in performance or function within a given area of an end product device or system.

The nature of the disclosed invention is a means to bridge the gap between the semiconductor device and the final end product, by embedding the semiconductor device and associated active and passive components within a Liquid Crystal Polymer assembly that essentially merges the semiconductor package and the normal printed circuit assembly into an integrated final end product or sub-assembly that will be assembled into a final product.

The embedding of the various microelectronic devices into the LCP platform is a core aspect of the invention, but embedding the devices alone is does not provide the intended function as all devices must be interconnected electrically, optically, mechanically etc. to provide the final end product or desired system function. Embodiments disclosed herein include structures and methods for embedding and interconnecting a set of features and microelectronics devices directly into a LCP based assembly where the assembly can serve as the final end product directly or a sub-assembly that is eventually interconnected and assembled into the end product or system.

One use for the disclosed technology is to create a platform for microelectronics device integration, where micro circuitry embedded within a LCP structure is fine enough to enable embedded direct die attach of integrated circuit devices that are normally used as a packaged component in a much larger assembly. The design envelope principle is illustrated to establish a group of features that can be added to the platform.

FIG. 1 is a see-through perspective view of an example LCP structure 102 including LCP material 104 having circuit components and other function features 106 embedded or defined therein. In the LCP structure 102 a base architecture can be defined for the desired function of the ultimate device, and functional features and structures 106 are embedded into LCP material 104 to create the LCP structure 102. The features, functions, and components 106 embedded are organized based upon the proper design, with internal functions embedded within the LCP material 104 and external interfaces provided as needed. The example used is a basic simple assembly that contains theoretical devices and feature sets for descriptive purposes, and embodiments disclosed invention can also be used for more complex industry specific and functional designs that contain all of the function, features, and devices required for the end product desired purpose.

Existing uses of PCBs with LCP layers limit the PCB's function solely to that of a substrate for the electrical circuits and components thereon/therein. Embodiments described herein, however, use fabrication techniques to incorporate electronic circuits, electronic components, and/or fluidic channels or reservoirs into LCP material that also functions as a structural member of a device. For example, electronic circuits, components, and/or fluidic channels or reservoirs can be embedded within LCP material that is a monolithic part of an external housing or shroud for a device. As another example, electronic circuits, components, and/or fluidic channels or reservoirs can be embedded within LCP material that is a rigid member providing physical structural support for a device.

One area in which such an LCP material with embedded components can be used is for a medical device. The medical device industry is entering a period of innovation where health care is being driven by the data collection, diagnostics, analytics and electronics integration. Historically, medical devices have not been technology drivers such as the handset or computer industries, with recent introductions of wearable devices taking advantage of the manufacturing advances of higher volume production and electronics integration. Most of the wearable devices have some medical or healthcare related data collection functions, but these are typically not diagnostic level accuracy or complexity. As the communications industry moves towards 5G protocols, there appears to be a significant desire to connect medical devices and transmit and process data in real time in a manner that has meaningful impact to outcomes and analytics. The medical device industry has also been less concerned about physical size of devices as well as the physical size of components and circuitry, with usually small to medium volumes that do not justify high volume manufacturing techniques. Another aspect of the medical device industry is historically, patient data or conditions has typically collected by a dedicated instrument type and collected manually for further review compiled with other results with highly integrated electronics not a priority. In general, a specific device is focused on the desired outcome or performance of the device with electronics integration and design for high level manufacturing often a lower concern.

The use of the term medical device is somewhat generic as there are many different classifications of medical devices. Some are implantable and perform a function for the patient, some are used for procedures, some collect data or vital signs, some are used for diagnostics or chemical analysis, some are used for patient monitoring etc. The conditions and location of use are also varied, from point of care, to in procedure, to in home patient use. The sales channels also vary widely from hospitals, to clinics or pharmacies, to general direct to consumer.

The benefits of LCP materials combined with high density precision circuit fabrication techniques and sophisticated microelectronics assembly methods create a platform for design and fabrication of highly integrated medical devices not possible with previous or conventional methods.

Embodiments described herein can include multi-layer circuits within the LCP material to define a 3-D interconnect structure that connects the microelectronics features, devices, components and electrical interfaces. In addition, mechanical functions can be embedded in a fashion and proximity such that the embedded electronics can interface and interact with each other as well as introduced conditions relevant to the function of the device and the outside world or environment it is exposed to.

Embodiments described herein enable a dramatic increase in functional density and significant size reduction by integrating devices normally assembled as a group of packaged and discrete devices. Combining this micro-electronics integration with unique mechanical structures and features that feed the electronics to perform the desired outcome is an advantage over traditional methods.

Embodiments described herein enable embedding of very fine line printed circuits within the LCP based device. Traditional medical devices contain printed circuits in the 75 micron to 100 micron line and space range produced on discrete substrates that are assembled with packaged IC devices and a mix of discrete passive devices. LCP based embedded printed circuits can be fabricated within an embedded multi-layer circuit stack in the 9 to 25 micron line and space range with further scaling possible in the 2 micron range. This capability enables the direct attach of IC devices in die format rather than in the packaged format normally used which has a much larger terminal pitch and larger physical footprint. Directly attaching die in a very fine circuit pattern not only eliminates the normal semiconductor package, it allows for devices to be located much closer to each other which increases functional density and reduces interconnect distance between devices improving performance and power requirements that can increase battery life for wearable or mobile devices.

Figure 2A:
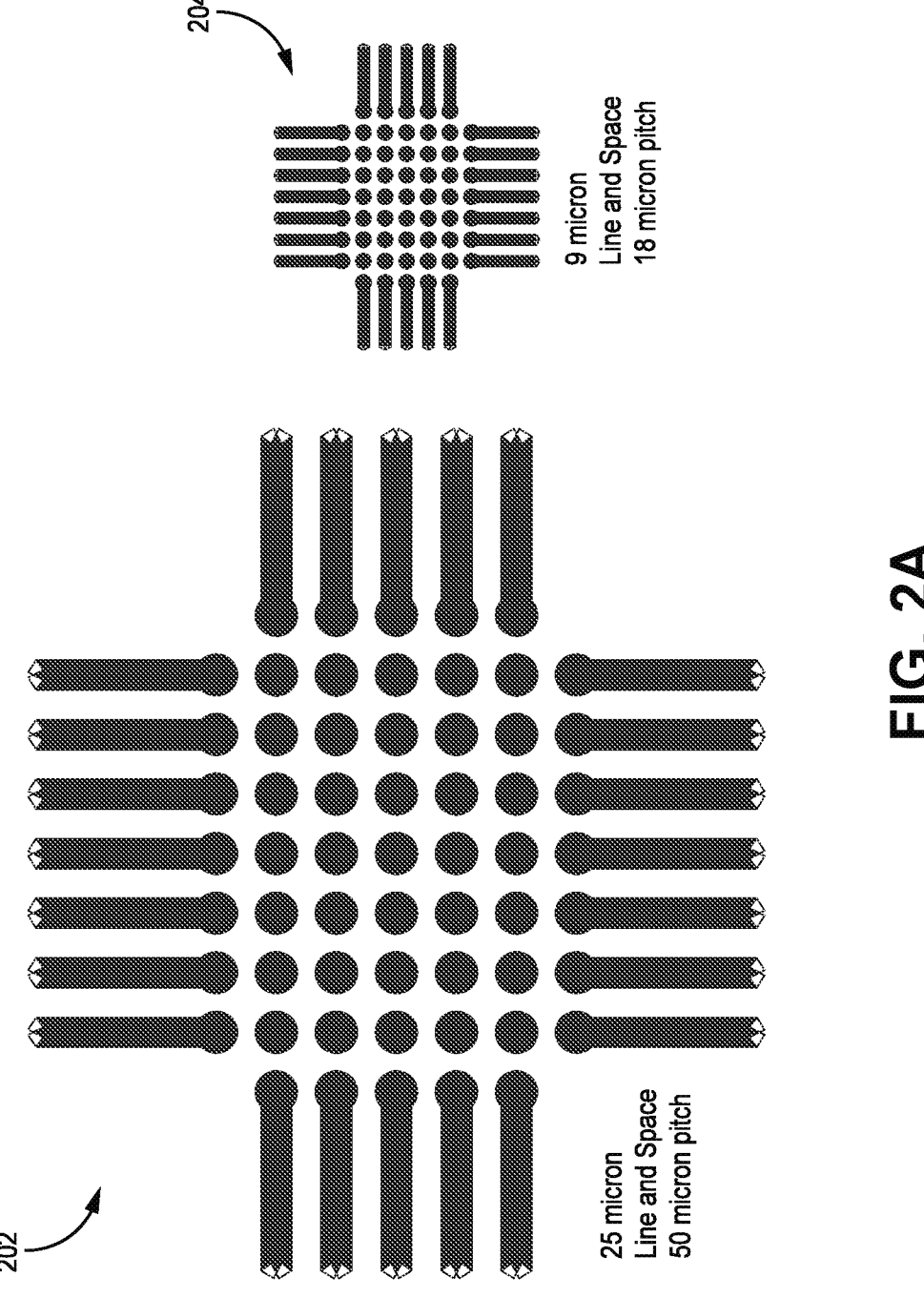
FIG. 2A illustrates the comparative size to scale of LCP embedded micro-circuitry for embodiments herein.

FIG. 2A illustrates the comparative size to scale of LCP embedded micro-circuitry for embodiments herein. Reference numeral 202 indicates a direct die bond pad with 25 micron lines and spaces and a 50 micron terminal pitch. This capability enables a large percentage of conventional packaged die to be mounted directly without the need for the package substrate. Reference number 204 indicates direct die bond pad with 9 micron lines and spaces in relative size to the 25 micron lines and spaces shown at 202. Using 9 micron lines provides a 74% increase in functional density and enables finer routing capabilities.

Figure 2B:
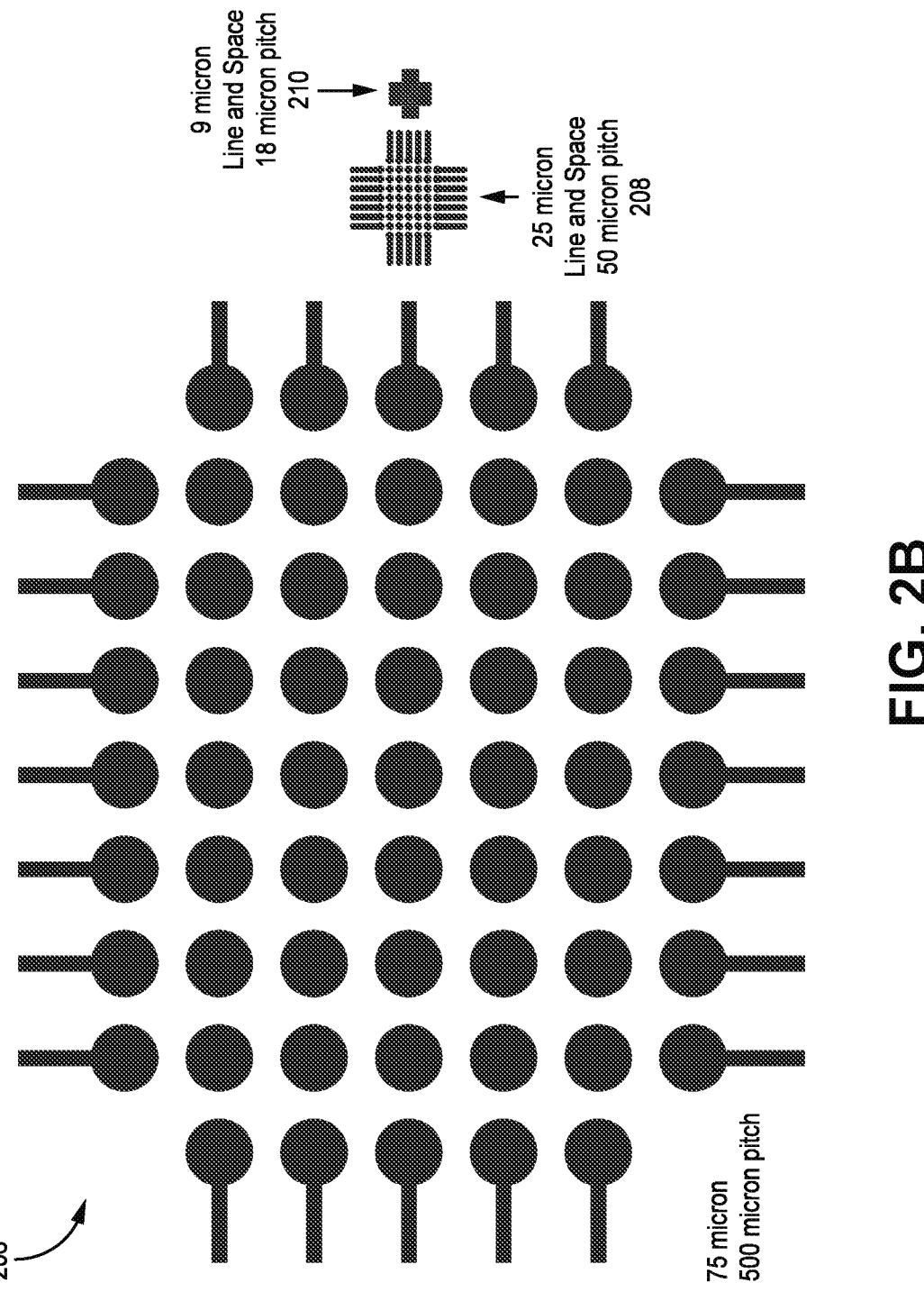
FIG. 2B illustrates the comparative size to scale of micro-circuitry in a die bond pad.

FIG. 2B illustrates the comparative size to scale of micro-circuitry in a die bond pad. Reference numeral 206 is a die bond bad at 500 micron pitch. Reference numeral 208 is a die bond pad at a 50 micron pitch shown in relative scale to the 500 micron pitch. Reference numeral 210 is a die bond pad at an 18 micron pitch shown in relative scale to the 500 micron pitch and the 50 micron pitch. The effective footprint for the same pin count at 500 micron pitch is 10× the size of the 50 micron die bond pad and almost 30 times larger than the 18 micron pitch.

Figures 3A, 3B, 3C, 4A, 4B, 4C, 4D:
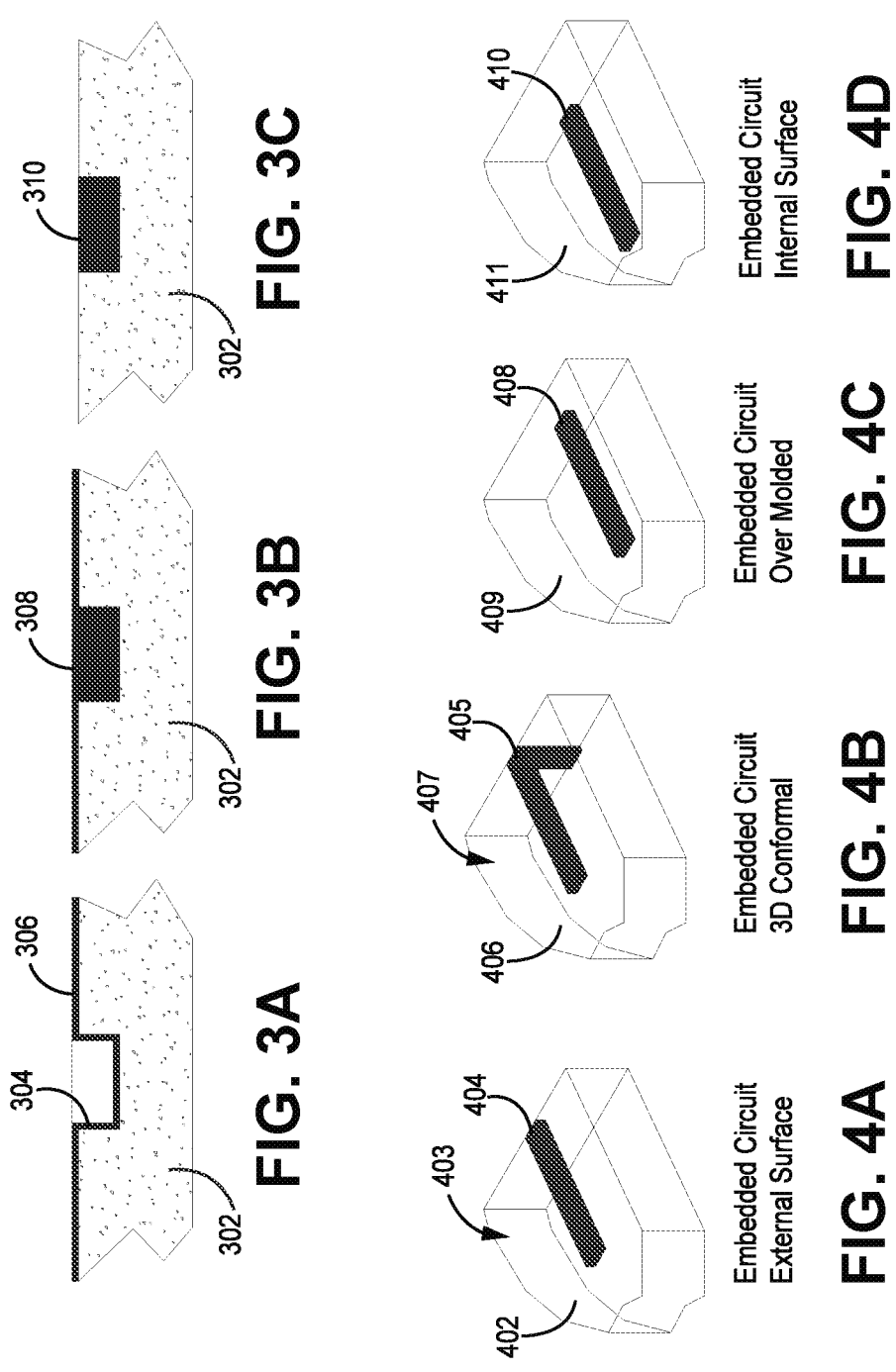
FIGS. 3A-C are cross-sectional views of example stages of fabricating a line of copper within a layer of LCP.
FIGS. 4A-D are cross-sectional views of an example completed LCP structural member having a line of copper formed therein.

FIG. 3A-C are cross-sectional views of example stages of fabricating a line 310 of copper within a layer 302 of LCP. In FIG. 3A a laser ablated groove 304 formed in the LCP layer 302. The laser beam is focused within the parameters of the focal length such that the groove 304 is formed by beam focus and power setting to create a desired depth into the molded LCP with a wide range of fillers depending on the mechanical or electrical properties desired. A thin layer of electroless plated copper 306 is deposited on the exposed surface of the LCP layer 302 coating the surfaces of the groove 304. In FIG. 3B copper 308 is electro-deposited on top of the electroless plated copper 306 to fill the groove 304. The electroless copper 306 serves as a conductive bus for the electro-deposited copper. In FIG. 3C excess electroless copper is etched away, leaving only the desired circuit line 310 embedded in the LCP layer 302. Additional LCP layers can be formed with or without electronic circuits, components, and/or fluidic channels or reservoirs. The additional LCP layers can be placed on top of the LCP layer 302 having the line 310 formed therein in an over molding process in order to embed the line 310 within an LCP structure. Embedding the line 310 provides resistance to corrosion and other damage to the line 310. The multiple LCP layers can be bonded together in any suitable manner including via lamination. The multiple LCP layers can have a geometry such that the resulting structure formed of the LCP with embedded electronic circuits, components, and/or fluidic channels or reservoirs functions as a structural component of a device. Examples of such a structural component include a housing, shroud, or other physical support member.

FIGS. 4A-C are cross-sectional views of an example completed LCP structural member having a line of copper formed therein. FIG. 4A is a cross-sectional view of a line 404 formed in an external surface 403 of an LCP member 402. FIG. 4B is a cross-sectional view of a line 405 formed within an LCP member 406 orthogonal to an external surface 407 and connecting with a line 406 formed on the external surface 407. FIG. 4C is a cross-sectional view of a line 408 embedded within an LCP member 409 via over-molding. FIG. 4D is a cross-sectional view of a line 410 formed on an internal surface of an LCP member 411. These lines can be used for coupling electronic components within or external to the LCP member or can function as antennas, among other things. There are virtually unlimited configurations and interconnecting nets that these lines can form with options for mounting devices as well as providing internal or external interconnection points or terminals. The laser patterning of the molded LCP does not require a metal loading of the mold compound as with conventional Molded Interconnect Device (MID) constructions often used for antennae applications.

As discussed above, the printed circuit formed in the LCP structure can be created integral to the end product device during the assembly process, with corresponding components embedded as part of the end product assembly process. This is in contrast to a separate printed circuit assembly that is mounted intact into an end product device being assembled. The embedding process may include a pre-fabricated circuit component or a sub-assembly circuit with components pre-assembled yet still embedded into a structural member of the final end product device via over-molding of additional LCP layer(s) onto the pre-fabricated circuit to form the end structural member.

Figures 5A, 5B, 6A, 6B, 7, 8A, 8B:
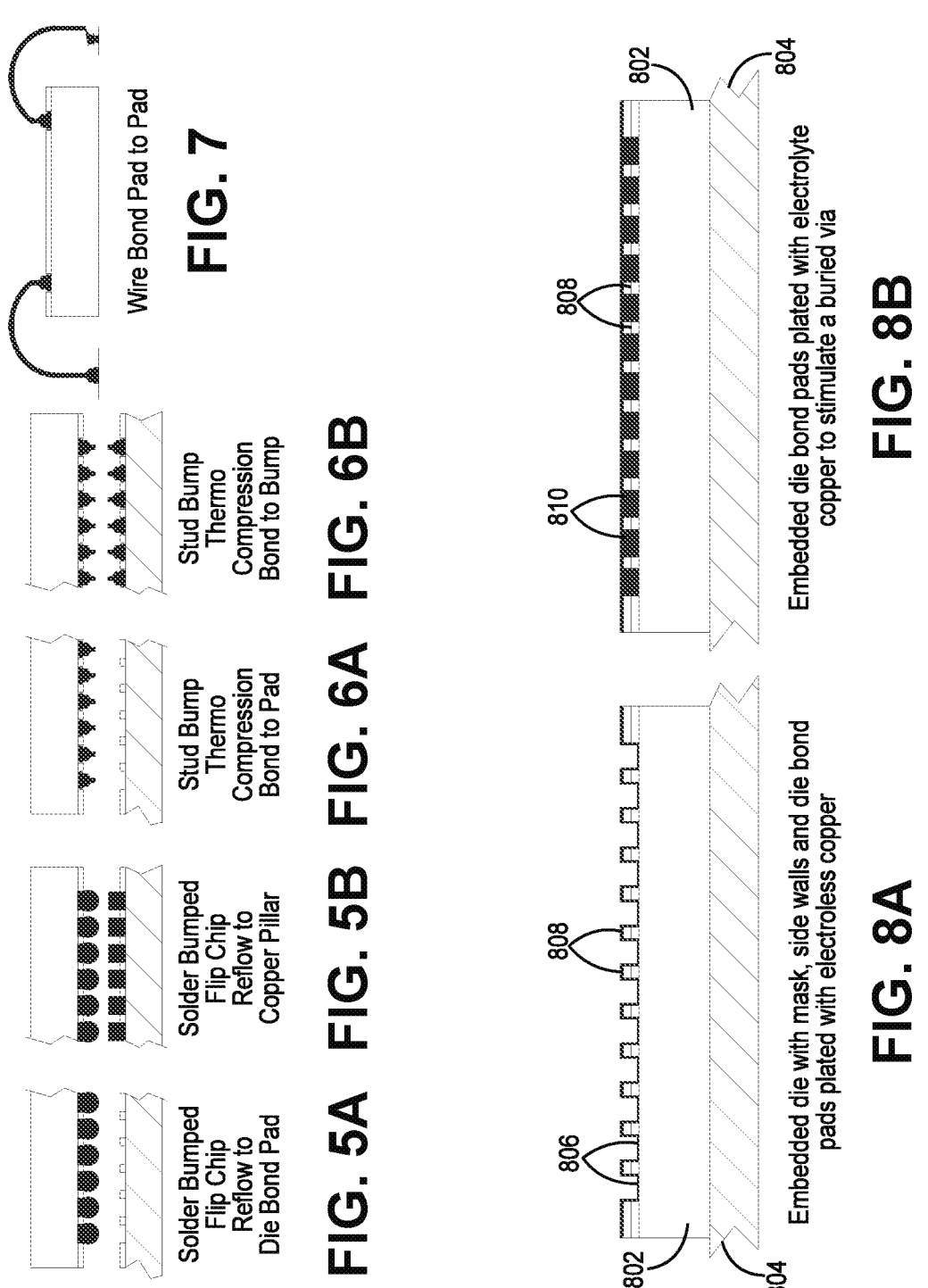
FIGS. 5A-B, 6A-B, and 7 are cross-sectional views of example die mount processes that can be used to mount a bare (unencapsulated) die onto a layer of LCP.
FIGS. 8A-B are cross-sectional views of an alternative die attach process for embedding a die within an LCP structure.

FIGS. 5A-B, 6A-B, and 7 are cross-sectional views of example die mount processes that can be used to mount a bare (unencapsulated) die onto a layer of LCP. The die can include any desired components, such as an integrated circuit and/or sensor. FIG. 5A illustrates a solder bumped die flip chip reflowed to a die bond pad on an LCP layer. FIG. 5B illustrates a solder bumped die flip chip reflowed to copper pillars on an LCP layer. FIG. 6A illustrates a stud bumped die that is thermo compression bonded to a die bond pad on an LCP layer. FIG. 6B illustrates a stud bumped die that is thermo compression bonded to stud bumps on an LCP layer. FIG. 7 illustrate a die that is mounted to an LCP layer and wire bonded to terminals on the LCP layers. Each of these die mount process can be used to mount a die on an outer surface of an LCP member to via over-molding to embed a die within an LCP structure.

Each of the die mount processes described in FIGS. 5A-B, 6A-B, and 7 have advantages and disadvantages. Solder reflow temperatures can impact surrounding materials, thermo compression can damage thin or sensitive die, and wire bonding die can be poor electrically and requires more physical space for wire bond loops. Some wire bond die can be bumped to enable processing.

FIGS. 8A-B are cross-sectional views of an alternative die attach process for embedding a die within an LCP structure. In FIG. 8A a die 802 is mounted to an LCP layer 804. The die 802 is mounted with its backside adhered to the LCP layer 804 in any suitable manner, such as with an appropriate adhesive. The die bond pads 806 of the die 802 are disposed on the die surface facing away from the LCP layer 804. A mask 808 is deposited over the die bond pads 806 of the die 802 and etched away to form openings that expose the die bond pads 806. Electroless copper is then plated over the etched mask 808 covering the die bond pads 806, side walls of openings and upper mask surface. In FIG. 8B the openings of the mask 808 are filled with copper 810 by electroplating copper and etching away the excess. Additional layers of LCP with copper lines therein can then be built/placed on top of the die 802 to couple to the die bond pads 806 as desired. Accordingly, the blind vias 810 are fabricated on the die 802 to couple the die bond pads 806 to copper lines within the LCP structure.

FIGS. 9A-D are cross-sectional views of example processes of fusing additional layers of LCP with embedded conductive lines (among other things) to bond pads of a die. One of the disadvantages of conventional reflow processing is typically the entire assembly is subject to reflow temperatures above the melt point of solder. This may be particularly disadvantageous if the die is embedded while the LCP is a portion of a larger device or component, such that the larger device or component would have to be subject to the high temperature for solder melting.

In FIG. 9A an interposer 900 including a thin layer 902 of LCP with copper plated shallow vias 904 can be placed opposing solder bumps 906 on die bond pads 908 of a die 910. The die 910 can be mounted onto a base LCP layer 901. The interposer 900 is formed by creating a through hole pattern with holes in the position of vias 904, which correspond to the locations of solder bumps 906 on the die 910. The holes in the LCP layer 902 are plated with copper to create the vias 904. The LCP layer 902 with vias 904 is then brought into contact with the solder bumps 906, such that the vias 904 align with a contact the solder bumps 906. The exposed (upper) base of copper of the vias 904 is heated with short fast pulses 909 from a precision laser system, such that the vias 904 heat so fast and hot it transfers the laser energy to the solder bump 906 contacting the via 904. This reflows the solder at a that location only without subjecting the entire assembly or device to the thermal profile. The surrounding base LCP of the LCP layer 902 is a heat insulator and does not see the same thermal shock as the solder bump 906 which acts as a heat sink. After melting the solder solidifies and the joint is created. The speed of precision laser systems is sufficient to provide very fast selective soldering and can be faster than a reflow process.

In FIG. 9B an interposer includes a thin layer 912 of LCP with copper plated vias extending to copper pillars 914 is brought into contact with solder bumps 906 on a die 910. The LCP layer 912 with copper pillars 914 can be formed in a similar manner to the layer 902 of FIG. 9A, except excess copper is deposited on the bottom of the LCP layer 912 and etched away if needed to form the pillars 914. The copper pillars 914 can be joined to the solder bumps 906 using heat from a laser in the same manner as described with respect to FIG. 9A.

In FIG. 9C an interposer includes a thin layer 916 of LCP with copper plated through holes 918 is brought into contact with solder bumps 906 on a die 910. The LCP layer 916 with plated through holes 918 can be formed in a similar manner to the layer 902 of FIG. 9A, except copper is not plated to fill the entire hole in the LCP layer and is etched away such that is only remains on the side walls of the holes. The copper in the through holes 918 can be joined to the solder bumps 906 using heat from a laser applied through the through hole 918 and onto the solder bump 906 to melt the solder bump 906 and allow the through holes 918 down onto/around the solder.

In FIG. 9D an interposer includes a thin layer 920 of LCP with copper plated shallow open blind vias 922 is brought into contact with solder bumps 906 on a die 910. The LCP layer 920 with open blind vias 922 can be formed in a similar manner to the layer 916 of FIG. 9C, except copper is not plated thickly on the walls and across an upper surface of the holes in the LCP layer. Copper can be etched away such that is only remains on the side walls of the holes and a layer extending across a top of the holes to form a blind via. The copper in the blind vias 922 can be joined to the solder bumps 906 using heat from a laser in the same manner as described with respect to FIG. 9A. It should be understood that the references to the "top", "bottom", "upper", or "lower" are with respect to the Figures only and that the LCP layer and die can be used in any appropriate orientation.

FIGS. 10A-10C are cross-sectional views of example processes and structures for fusing additional layers of LCP to an IC having stud bumps on a bond pad thereof. As known, a stub bump is created by wire-bonding wire material to a bond pad and terminating the wire (ball) to form a stud on the bond pad. Stud bumps can be composed of any suitable material such as copper or gold.

In FIG. 10A, an interposer 1001 composed of a thin layer 1002 of LCP with copper plated shallow vias 1004 can be placed opposing stud bumps 1006 on die bond pads 1008 of a die 1010. The interposer 1001 can be formed by creating a through hole pattern with holes in the position of vias 1004, which correspond to the locations of stud bumps 1006 on the die 1010. The holes in the interposer 1001 are plated and filed with copper to create the vias 1004. The interposer 1001 is then brought into contact with the stud bumps 1006, such that the vias 1004 align with and contact the stud bumps 1006. The exposed (upper) base of copper of the vias 1004 is heated with short fast pulses from a precision laser system while the vias 1004 are in contact with the stud bumps, such that the vias 1004 heat fast and hot to transfer the laser energy to the stud bump 1006 contacting the via 1004. This reflows the stud bump at that location only without subjecting the entire assembly or device to the thermal profile. The surrounding base LCP of the LCP layer 1002 is a heat insulator and does not see the same thermal shock as the stud bump 1006 which acts as a heat sink. After melting the stud bump metal solidifies and the joint is created. The speed of precision laser systems is sufficient to provide very fast selective joining and can be faster than a traditional reflow process.

In FIG. 10B an interposer 1015 composed of a thin layer 1016 of LCP with copper plated through holes 1018 is brought into contact with stud bumps 1006 on a die 1010. The LCP layer 1016 with plated through holes 1018 can be formed in a similar manner to the layer 1002 of FIG. 10A, except copper is not plated to fill the entire hole in the LCP layer and is etched away such that is only remains on the side walls of the holes. The copper in the through holes 1018 can be joined to the stud bumps 1006 by heat from a laser applied through the through hole 1018 and onto the stud bump 1006 to melt the stud bump 1006 and allow the through holes 1018 down onto/around the stud bump 1006.

In FIG. 10C an interposer 1019 is composed of a thin layer 1020 of LCP with copper plated shallow open blind vias 1022. The interposer 1019 is brought into contact with stud bumps 1006 on an IC 1010. The LCP layer 1020 with open blind vias 1022 can be formed in a similar manner to the layer 1016 of FIG. 10C, except copper is not plated thickly on the walls and across an upper surface of the holes in the LCP layer. Copper can be etched away such that is only remains on the side walls of the holes and a layer extending across a top of the holes to form a blind via. The copper in the blind vias 1022 can be joined to the stud bumps 1006 using heat from a laser in the same manner as described with respect to FIG. 10A.

FIGS. 11A-11C are cross-sectional views of other example processes and structures for fusing additional layers of LCP to an IC having stud bumps on a bond pad thereof. As known, a stub bump is created by wire-bonding wire material to a bond pad and terminating the wire (ball) to form a stud on the bond pad. Stud bumps can be composed of any suitable material such as copper or gold.

In FIG. 11A, an interposer 1101 composed of a thin layer 1102 of LCP with solder filled vias 1104 can be placed opposing stud bumps 1106 on bond pads 1108 of an IC 1110. The interposer 1101 can be formed by creating a through hole pattern with holes in the position of vias 1104, which correspond to the locations of stud bumps 1106 on the IC 1110. The holes in the interposer 1101 are plated with copper and filled with solder paste to create the vias 1104. The interposer 1101 is then brought into contact with the stud bumps 1106, such that the vias 1104 align with and contact the stud bumps 1106. The exposed (upper) base of solder paste of the vias 1104 is heated with short fast pulses from a precision laser system while the vias 1104 are in contact with the stud bumps 1106, such that the solder paste in the vias 1104 reflows and fuses to the stud bumps 1106. This reflows the solder paste at that location only without subjecting the entire assembly or device to the thermal profile. The surrounding base LCP of the LCP layer 1002 is a heat insulator and does not see the same thermal shock as the solder paste and stud bump 1106 which act as a heat sink. After melting the solder paste solidifies and the joint is created. The speed of precision laser systems is sufficient to provide very fast selective joining and can be faster than a traditional reflow process.

In FIG. 11B an interposer 1115 composed of a thin layer 1116 of LCP with copper plated through holes 1118 is brought into contact with stud bumps 1106 on an IC 1110. The LCP layer 1116 with plated through holes 1118 can be formed in a similar manner to the layer 1002 of FIG. 10A, except copper is not plated to fill the entire hole in the LCP layer and is etched away such that is only remains on the side walls of the holes. The copper in the through holes 1118 can be joined to the stud bumps 1106 by crimping the interposer 1115 down onto the IC 1110 with a rigid structure above the hole 1118 which contact the stud bumps 1106 and cause them to deform to fill the through holes 1118. The holes 1118 are sized such that deforming/compressing the stud bumps places sufficient pressure on the plated walls for the holes 1118 to both provide electrical coupling and physically secure the interposer to the IC 1110.

In FIG. 11C an interposer 1119 is composed of a thin layer 1120 of LCP with copper plated shallow blind vias 1022 filled with a solder paste. The interposer 1119 is brought into contact with stud bumps 1106 on an IC 1110. The LCP layer 1120 with solder paste filled blind vias 1122 can be formed in a similar manner to the layer 1016 of FIG. 10C, except copper is not plated thickly on the walls and across an upper surface of the holes in the LCP layer and solder paste is filled in the recess of the vias. The copper in the blind vias 1022 can be joined to the stud bumps 1006 using heat from a laser to reflow the solder paste in the same manner as described with respect to FIG. 10A.

Figures 11D, 12A:
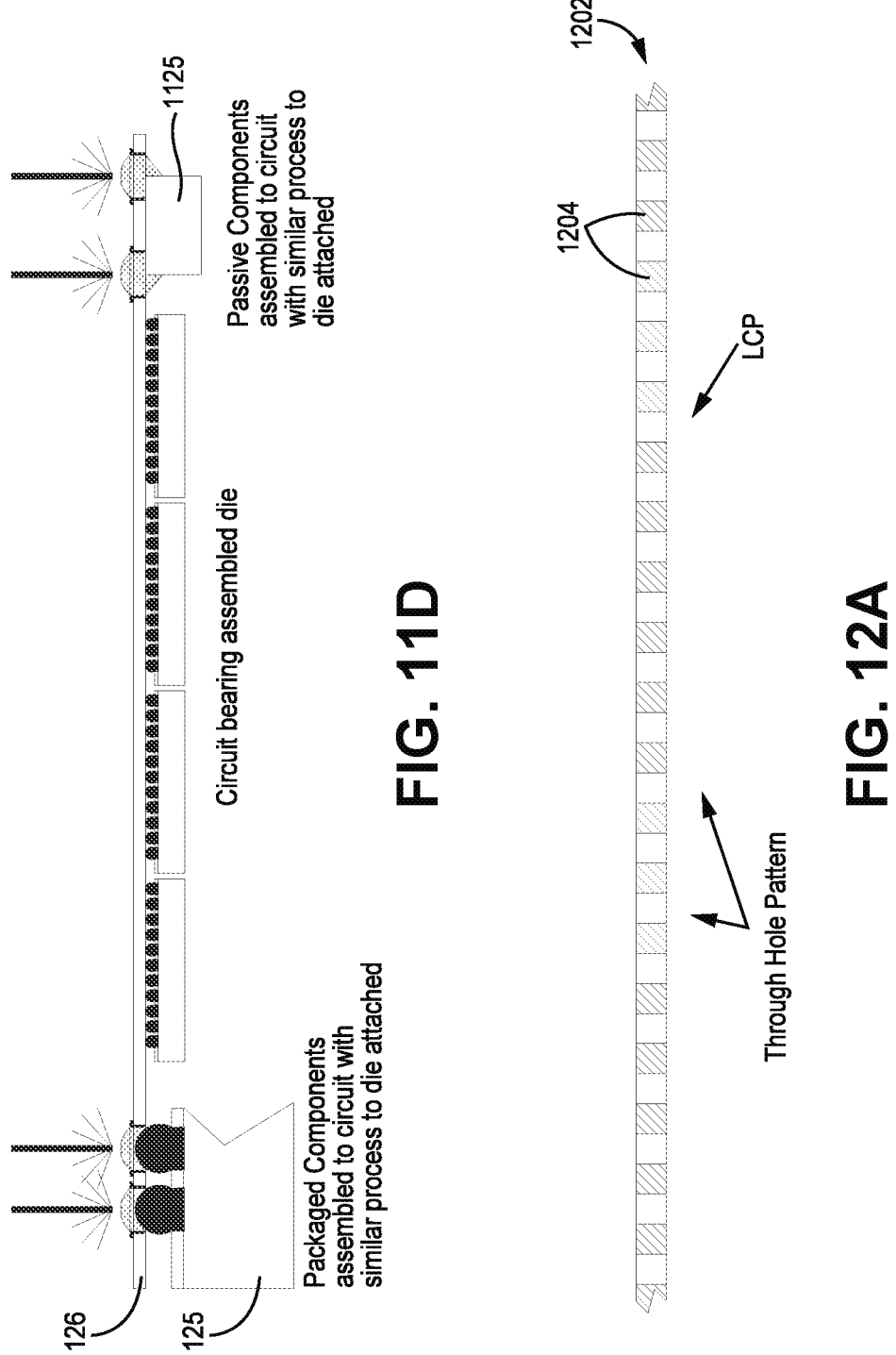

In FIG. 11D package IC components 1125 can be assembled to an LCP interposer 1126 using any of the above techniques. These processes can be used for traditional passive and active packaged ICs/devices that can be assembled to an LCP interposer 1126 bearing embedded die 1127 without causing reflow of previous joints that may be present. The exposed terminals also provide the potential for a functional test of individual or assembled components by probing exposed circuits or adding sacrificial circuits that can be removed post test.

The above processes can be used during fabrication of an LCP member that is a structural component (e.g., housing, shroud) of a device or can be used during fabrication of a printed circuit assembly (PCA) that functions solely as a substrate for circuits, etc. and is not a structural component of a device.

FIGS. 12A-I are cross-sectional views of an example process for fabricating an interposer that is composed of a thin layer of LCP with copper vias extending therethrough as described above. In FIG. 12A, the fabrication process begins with a layer of LCP material 1202 in which through holes 1204 having a terminal pattern of the desired assembly/die are formed. The though holes 1204 have a diameter based on the terminal size of the assembly/die to which it will be mounted. The through holes 1204 can be created in any suitable manner known to those skilled in the art, such as via laser cutting or etching. The through hole 1204 pattern reflects the theoretical mounting points for terminals on devices intended in the final assembly, or a subset of the desired terminal pattern. In FIG. 12A, the LCP material 1202 has no copper on either side.

Figures 12B, 12C, 12D:
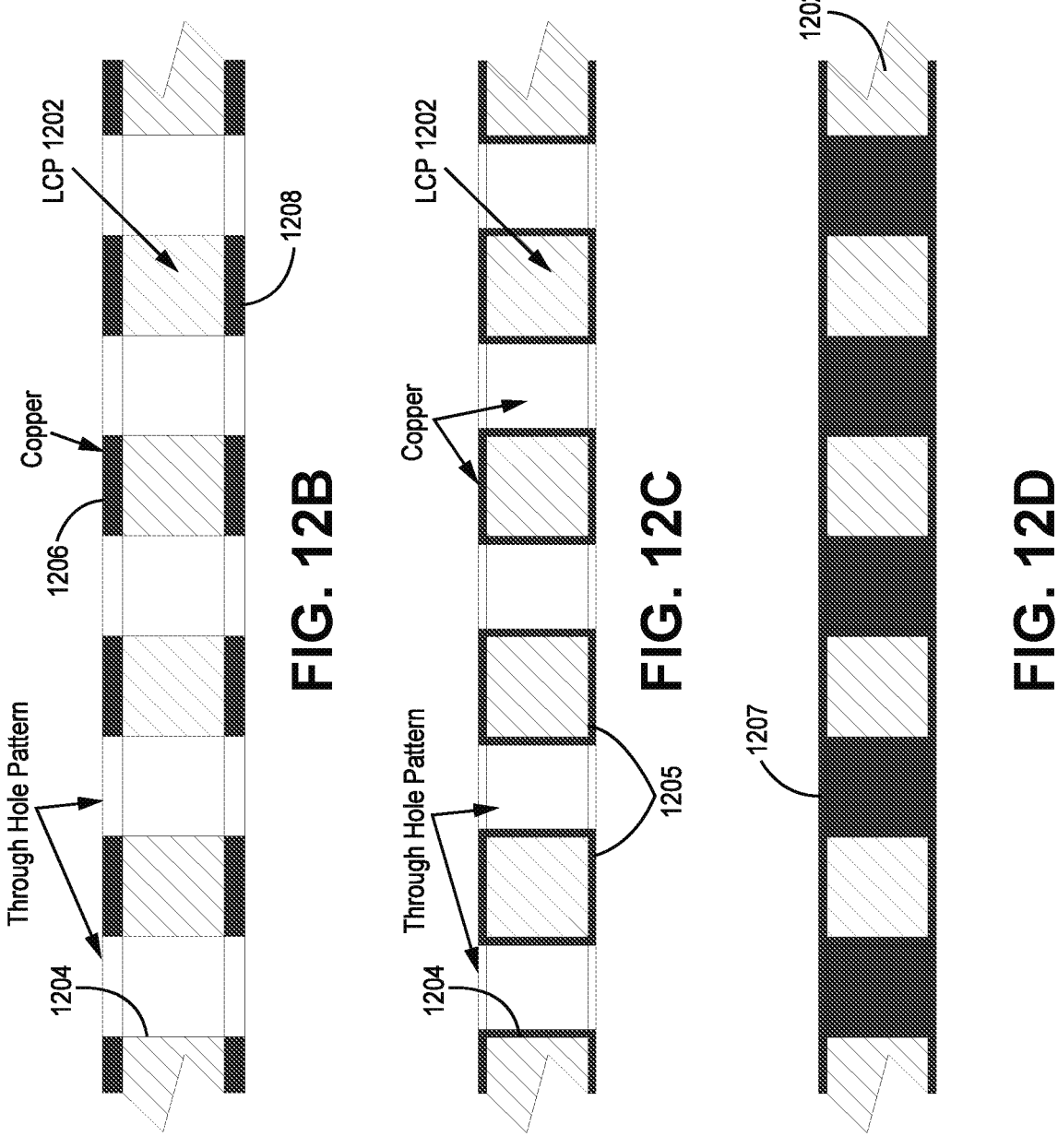

FIG. 12B is a cross-sectional view of another example beginning of the fabrication process in which the LCP material 1202 has a layer of copper 1206, 1208 on both sides that is perforated along with the LCP material 1202 to create the through holes 1204. Alternatively, the copper can be on just one side of the LCP material 1202.

In FIG. 12C, the pre-patterned LCP material 1202 is coated and metalized with electroless copper plating 1205 to render the surfaces and through hole walls electrically conductive.

In FIG. 12D, electrolytic copper 1207 is plated into the through holes 1204 to fill the pattern with copper and create a vertical electrical connection via.

Figures 12E, 12F, 12G:
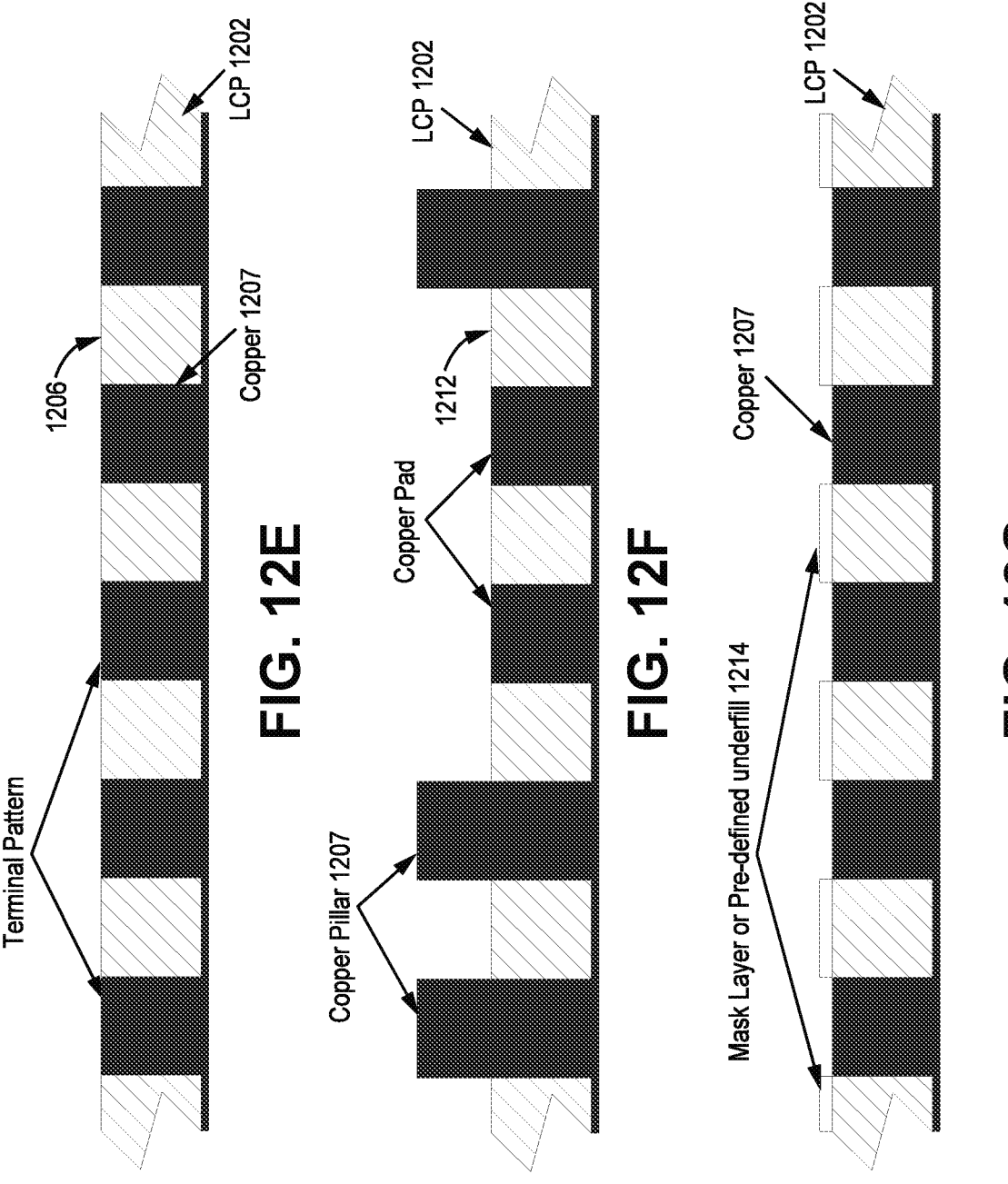

In FIG. 12E, in most cases it is desirable for at least the surface 1210 that will be mounted to the die to be free of copper so that the terminal locations are not shorted together. The exposed LCP on the surface 1210 can act as a mask and isolation between terminals. Copper can be etched off surface 1210 using known techniques as desired.

In FIG. 12F, in some cases the bond terminals can be extended beyond the exposed LCP surface 1212 to create copper pillar for terminal attachment as described above. The copper pillars can be created using known techniques, such as deposition.

FIG. 12G, in some cases a dielectric layer 1214 can be deposited on the exposed surface 1212 of LCP to improve electrical isolation between terminal attachment points. The dielectric layer 1214 can be deposited using known techniques. An alternative is to use a curable underfill dielectric as the dielectric layer 1214 that will provide terminal isolation as well as bond to the die surface to provide mechanical strength and reduce air voids between the die and the interposer as desired. In some cases, the dielectric layer can be used as a device alignment feature by defining the terminal attachment points are recesses that help self-align by directing the extending bumps on the die into the recesses.

Figures 12H, 12I:
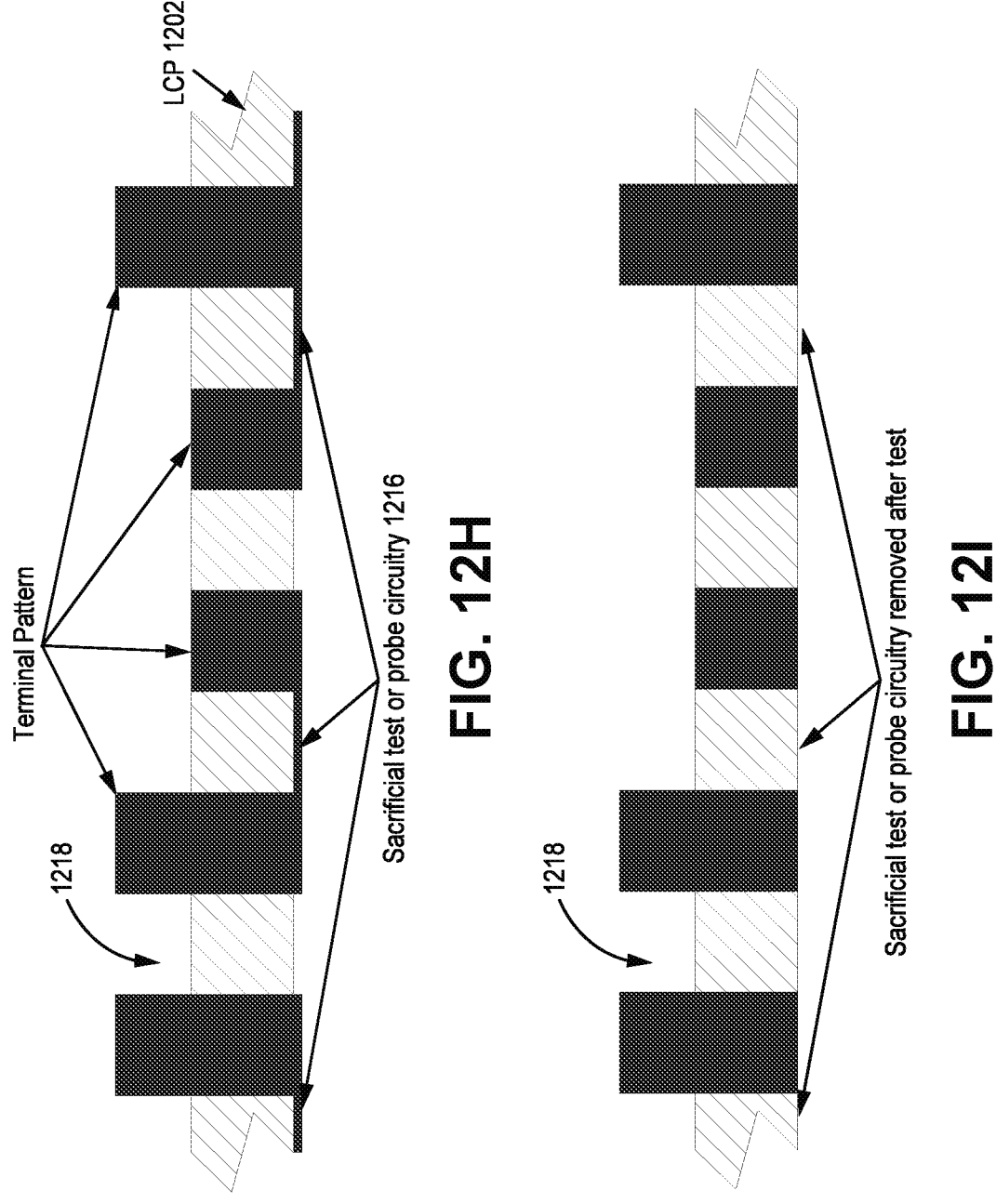

In FIGS. 12H and 12I, as die and devices are embedded in a larger LCP assembled structure and circuit, the interposer can include sacrificial circuit traces 1216 that initially connect the die to validation circuit patterns that validate or probe functionality of the die. The interposer can be mounted to the die with the validation circuit patterns coupled via the interposer to the die. After verification that the die is functioning properly, the sacrificial traces on the "back" side 1218 of the interposer that couple the die to the validation circuits can be etched away to disconnect the validation circuits and enable the die to be connected to other traces/components to perform its intended function in the system. If the die functionality cannot be validated or is determined to not be functioning properly the pre-assembly can be reworked or discarded and not subject to further assembly or processing.

Once an LCP interposer is mounted to a die one or more of such LCP interposer-die combinations can be overmolded with additional LCP material to create a larger LCP structure with the die(s) integrated therein. Any number of additional circuit or functional components can also be integrated into the LCP structure during fabrication. Advantageously, once the LCP interposer is mounted to the die, additional LCP material with desired traces/circuit components can be built onto the LCP interposer taking advantage of LCP's thermo-formation properties to create a monolithic structure from the LCP interposer and additional LCP material added thereon. As such, the interposer-die combination can be cleanly integrated into a larger LCP based assembly, such at that shown in FIG. 1. In respective examples, the interposers described herein can be less than 1,000 microns, less than 500 microns, less than 100 microns, less than 50 microns, or less than 10 microns thick.

Figures 13A, 13B:
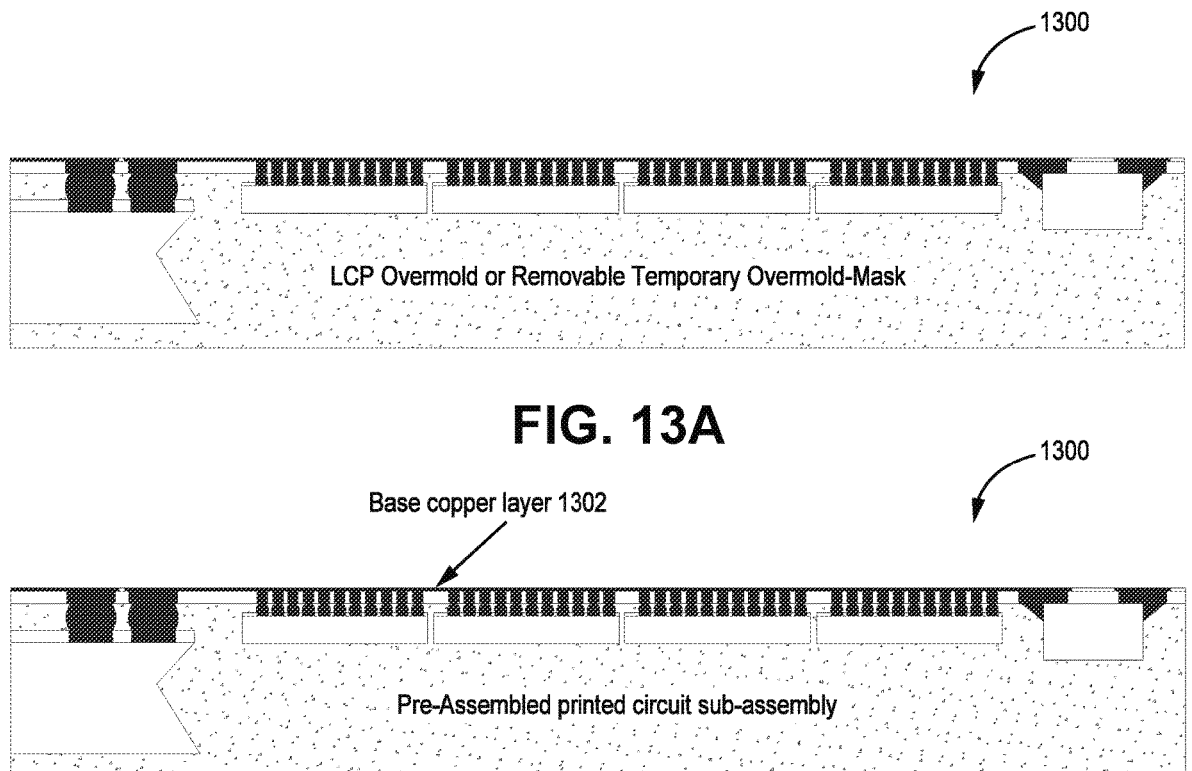
FIG. 13A is a cross-sectional view of an example of such a larger LCP based assembly having a single circuit layer.
FIG. 13B is a cross-sectional view of the LCP assembly in which the assembly is used for additional layer processing.

FIG. 13A is a cross-sectional view of an example of such a larger LCP based assembly 1300 having a single circuit layer. The printed circuit assembly (PCA) can be overmolded similar to a conventional semiconductor package. Most such PCAs are more complex that this example and include multiple layers of circuitry to interconnect the various components and devices. The assembly with devices mounted can be overmolded with LCP to encapsulate and protect the devices during use or further processing. The assembly can alternatively be overmolded with removable material to protect from further processing after which the LCP material can be removed.

FIG. 13B is a cross-sectional view of the LCP assembly 1300 in which the assembly 1300 is used for additional layer processing. The LCP assembly 1300 can be used as a pre-assembled PCA with a pre-defined metal layer 1302. The LCP assembly 1300 can then be processed further as if the assembly was a sub-lamination. The base copper layer connected to the vertical solid copper vias which terminate to the devices can be used as the initiation point for adding multiple circuit layers. The metal layer 1302 (e.g., composed of copper) can be pattern as desired using known techniques.

Figures 13C, 13D:
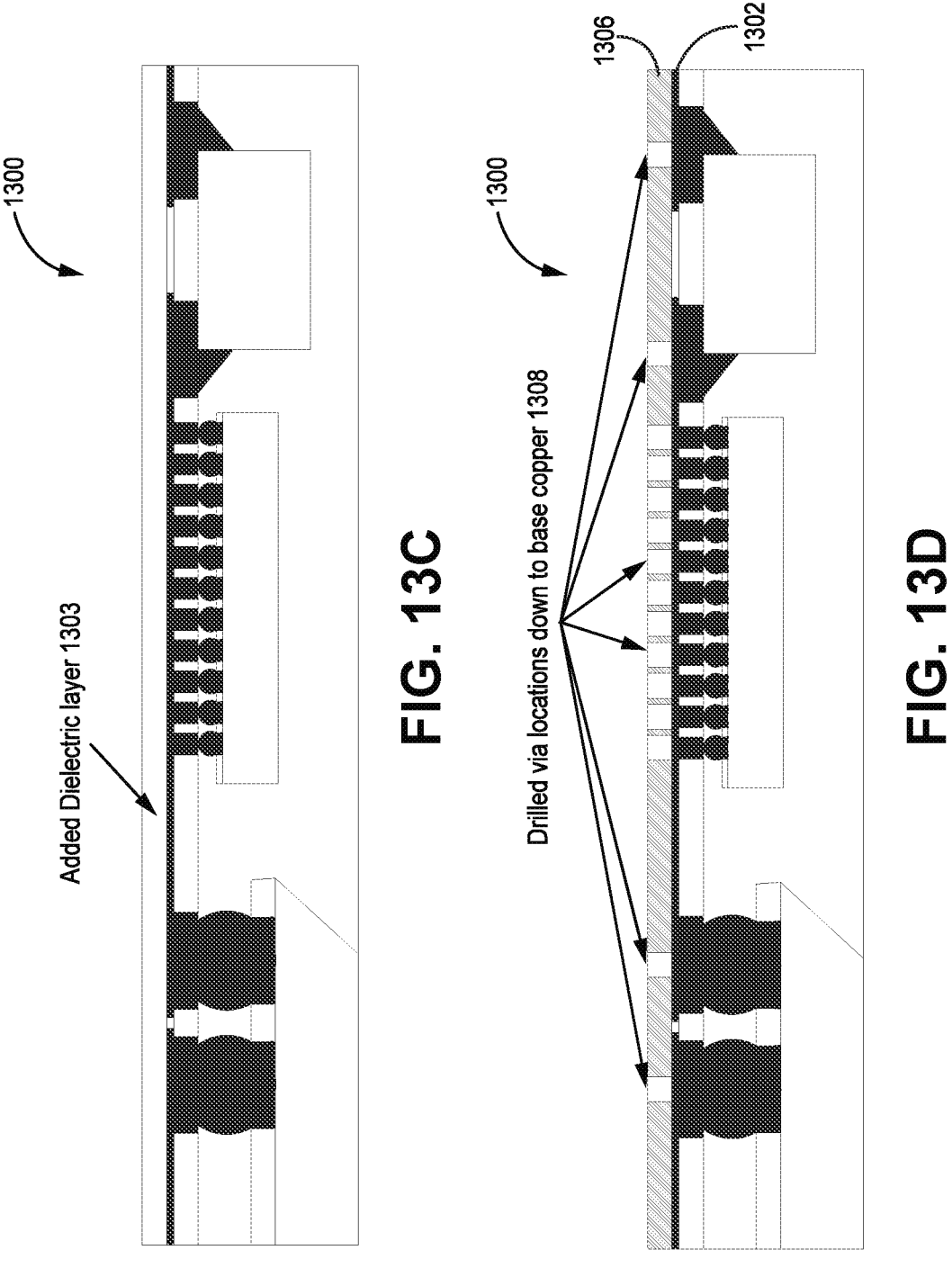
FIG. 13C is a cross-sectional view of the LCP assembly having a dielectric layer deposited over the base copper layer that has been patterned as desired.
FIG. 13D is a cross-section view showing additional layer(s) of circuit can be added to the assembly by mounting a layer of LCP material directly onto the metal layer of the pre-assembled sub-assembly.

In FIG. 13C is a cross-sectional view of the LCP assembly 1300 having a dielectric layer 1303 deposited over the base copper layer 1302 that has been patterned as desired. Device quantity has been reduced in this view to better illustrate the layers. Any appropriate known technique for depositing the dielectric layer and any appropriate known dielectric material can be used.

In FIG. 13D additional layer(s) of circuit can be added to the assembly 1300 by mounting a layer 1306 of LCP material directly onto the metal layer 1302 of the pre-assembled sub-assembly 1300. This is the reverse of traditional methods where IC components are mounted to a fully fabricated substrate or laminated printed circuit. In this example, the circuit is not yet built and is built on top of the integrated dies. Holes 1308 for vias can be formed through the LCP layer 1306 as desired to provide access to the metal layer 1302.

Figures 13E, 13F:
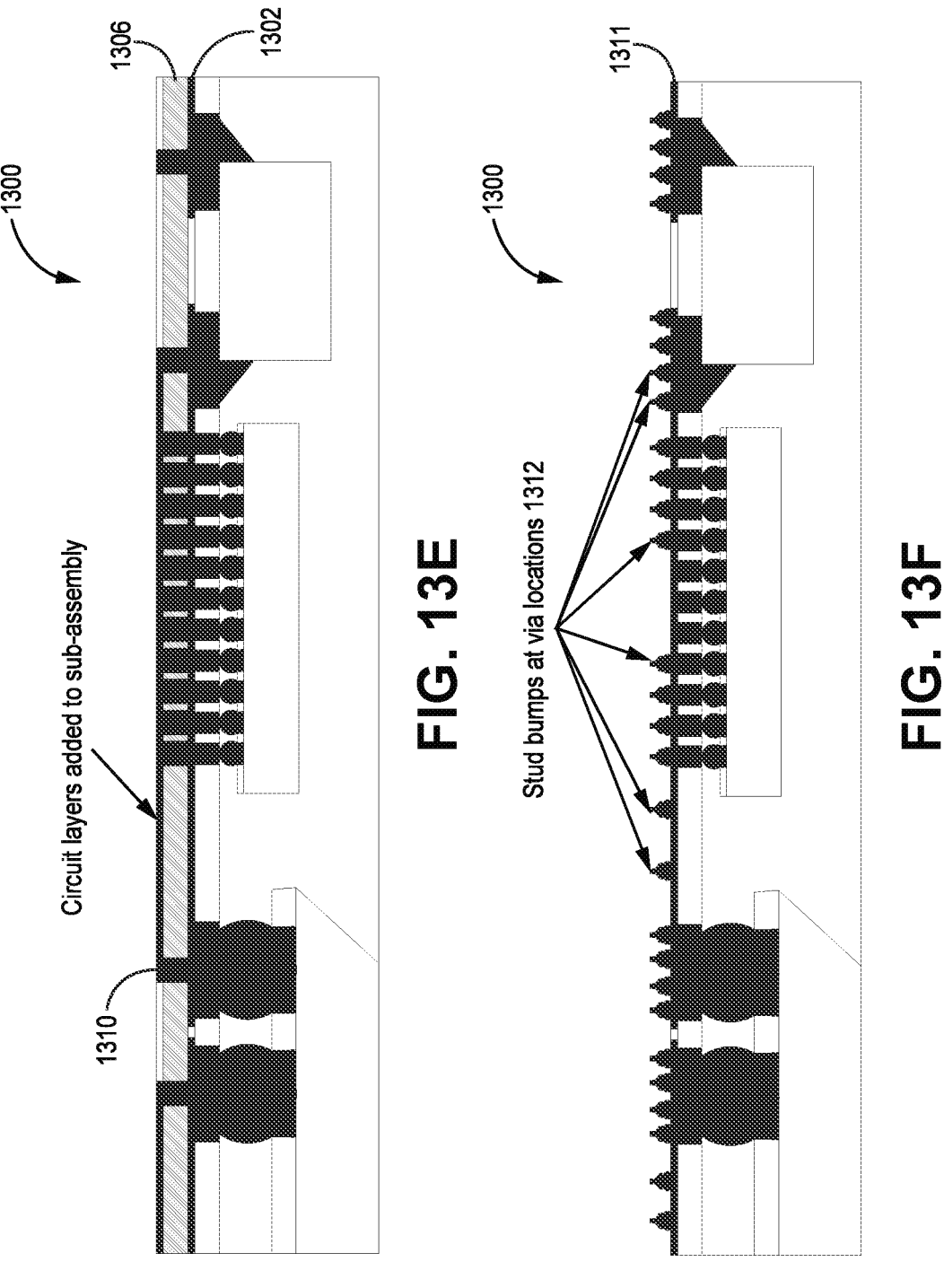
FIG. 13E is a cross-section view showing the holes can be metalized and full metal via copper is plated over the LCP layer to form next layer circuit patterns.
FIG. 13F is a cross-sectional view showing the electrolytic plating operation to deposit vias and additional metal layers of FIG. 13E subjects the pre-assembled devices/dies to electrical current.

In FIG. 13E the holes 1308 can be metalized and full metal via copper 1310 is plated over the LCP layer 1306 to form next layer circuit patterns. The steps of FIGS. 13D and 13E can be repeated as desired to add additional metal layers and components can be integrated for formed therein to form the desired 3D circuit stack.

In FIG. 13F the electrolytic plating operation to deposit vias and additional metal layers of FIG. 13E subjects the pre-assembled devices/dies to electrical current. In most cases this does not damage the devices/dies, but in some applications this electrical current may damage the devices/dies. Additionally, in most cases the overmold or temporary mask protects the lower assembly from plating chemistry wet processing, but in some cases the pre-assembled devices/dies can be damaged from this chemistry. In such applications it may be desirable to create multiple distinct sub-assemblies that can be fabricated separately and then assembled into a master assembly with a process that does not subject the devices/dies to the chemistry or electrical current. In FIG. 13F stud bumps 1312 can be created on any appropriate metal layer 1311 to enable the assembly to function as a sub-assembly. Any appropriate known technique can be used to create the stud bumps, which can be composed of any appropriate known material such as gold or copper. The bumps can be arranged on very fine pitch with accuracy enabling die level high density interconnect.

Figure 13G:
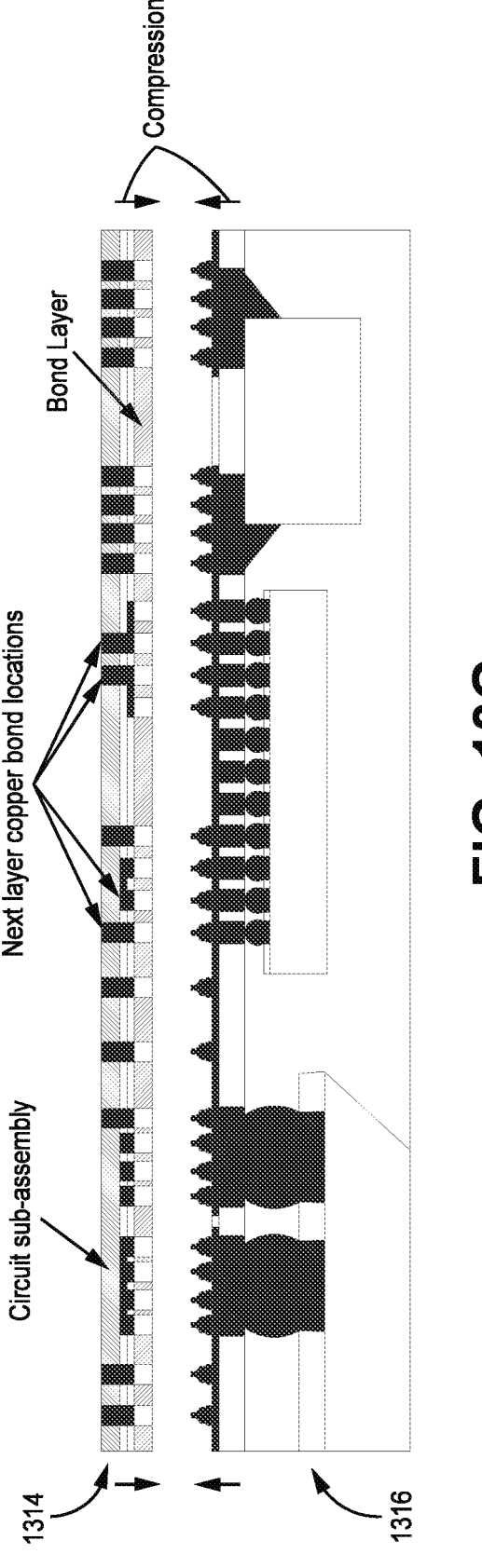
FIG. 13G is a cross-sectional view of two sub-assemblies that are being merged together by depositing stud bumps at desired locations with opposing copper engagement sites that when mated create the desired vertical electrical interconnect.

In FIG. 13G two sub-assemblies 1314, 1316 are merged together by depositing stud bumps at desired locations with opposing copper engagement sites that when mated create the desired vertical electrical interconnect. A bond layer is located between the circuit layers such that when laminated the electrical terminals are connected with stud bumps collapsing in the case of gold stud bumps to create metal to metal interface with the cured bond layer providing the mechanical structure to reinforce and hold the interconnect together through usage requirements. In some cases, the stud bumps may be made of copper which may pierce the opposing copper layer or collapse provided sufficient mechanical localized pressure. The bond layer adjusts during the lamination such that the areas between the connection points are filled with a controlled final thickness and surround the vertical interconnects to provide a strong mechanical bond sufficient to prevent separation. This process can be repeated multiple times with circuit bearing sub-assemblies that contain embedded devices, or only contain circuit layers which can also be multi-layer sub-assemblies. In addition, the base process can be performed with multiple circuit sub-assemblies mated at once to reduce the lamination cycle count. The circuit sub-assemblies themselves can be created with the same process to fabricate multi-layer circuit sub-assemblies that do not contain embedded components and do not require copper plating operation to connect layers or create vias.

These embodiments lend itself to creating several multi-layer circuit sub-assemblies that may have embedded devices or desired features, with the vertical electrical interconnects created by plating stud bumps at desired locations and aligning those bumps to the desired next level interconnect while laminating with a process that engages the bumps to opposing copper locations and post cured mechanical support from bonding layers.

Figure 13H:
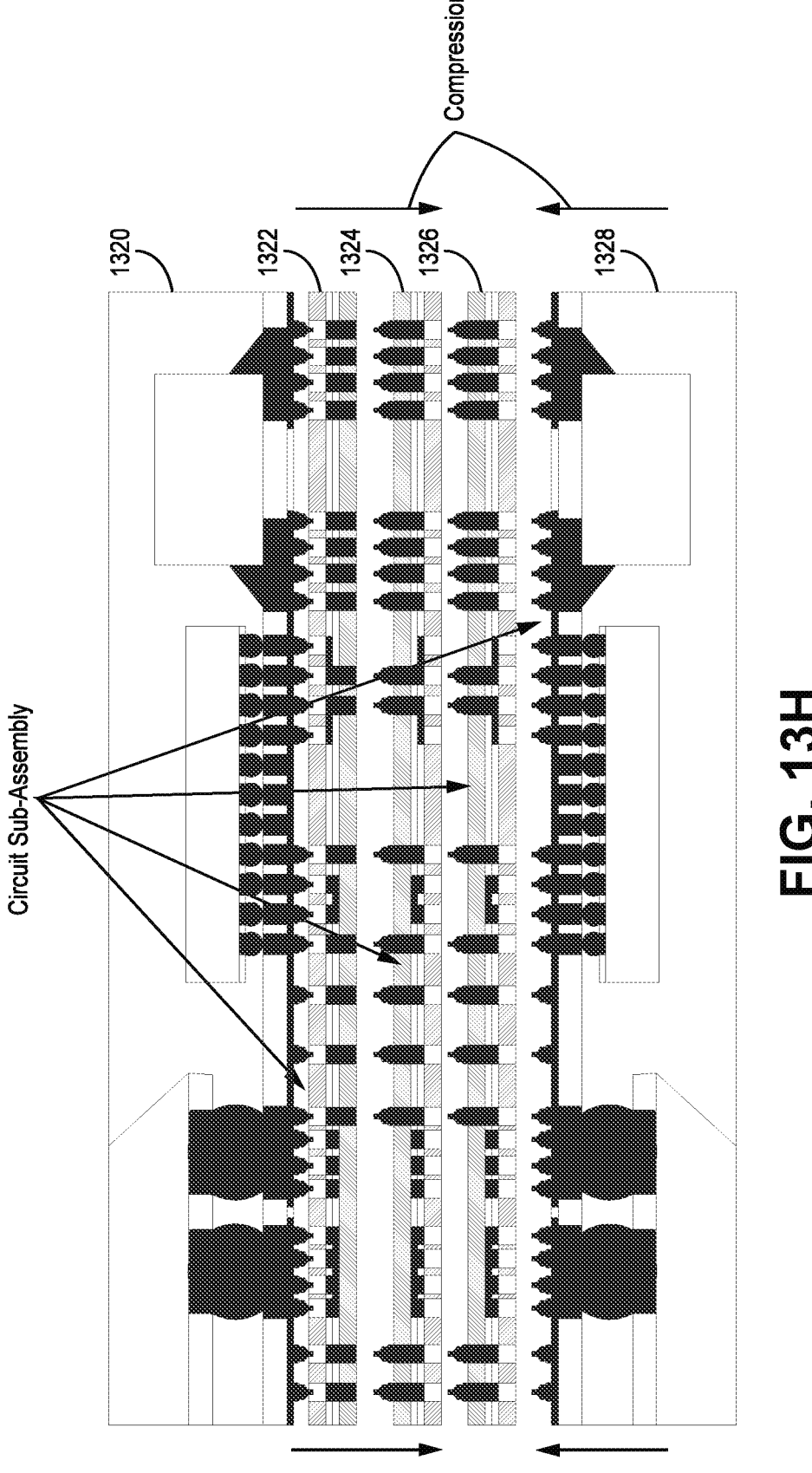
FIG. 13H is a cross-sectional view of multiple sub-assemblies being laminated together simultaneously.

In FIG. 13H multiple sub-assemblies 1320, 1322, 1324, 1326, 1328 can be laminated together simultaneously. The graphics represent a generic interconnect scheme, with unlimited variations and combinations possible. The basic underlying invention is based upon merging multi-layer circuit sub-assemblies by compression bonding stud bumped sub-assemblies with opposing metalized sub-assemblies in an engineered end product 3D electrical interconnect matrix without the need for conventional via plating or mass solder reflow.

Figure 13I:
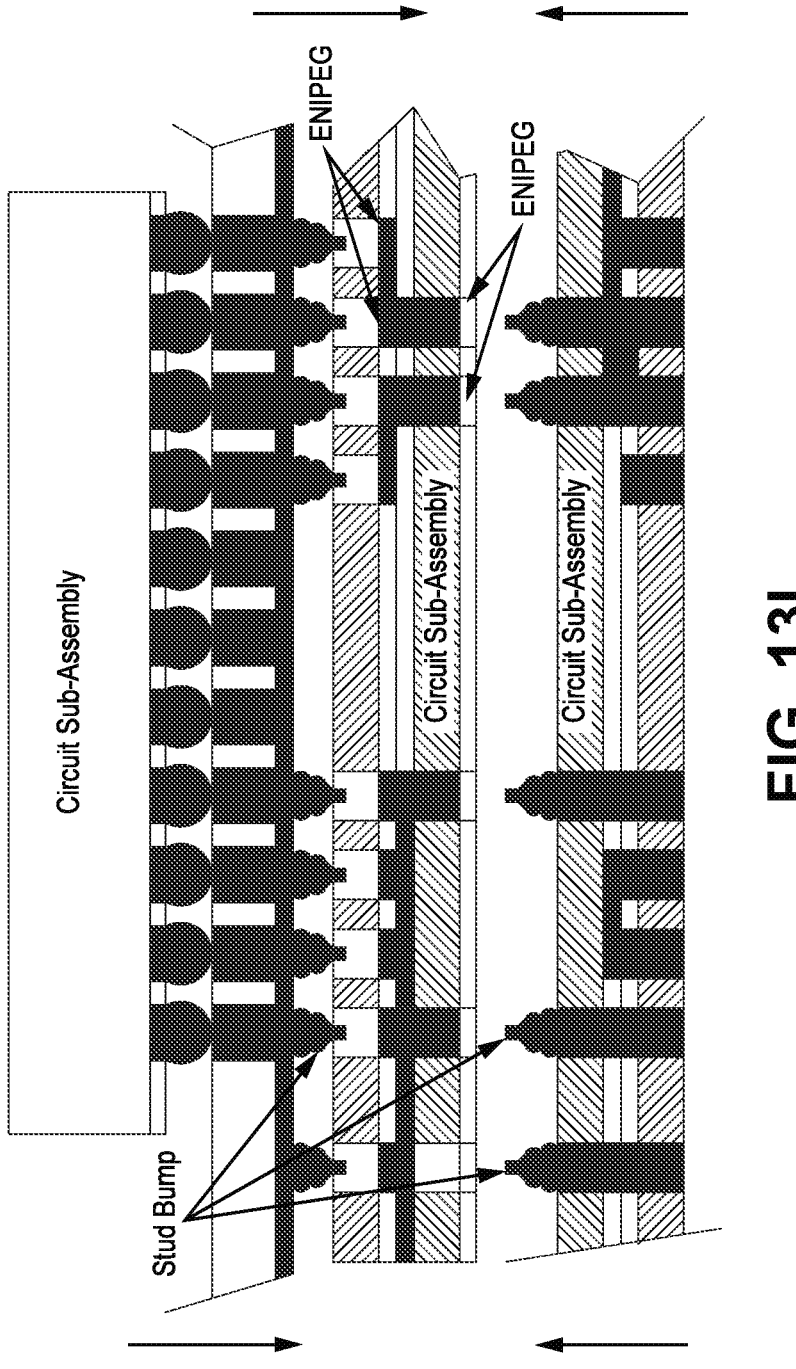
FIG. 13I is a cross-sectional view of an example of merging multiple circuit sub-assemblies where the sub-assembly can bear devices or bear only circuits in unlimited combinations and material sets.

FIG. 13I is a cross-sectional view of an example of merging multiple circuit sub-assemblies where the sub-assembly can bear devices or bear only circuits in unlimited combinations and material sets. This process enables embedding of mechanical and electrical features that cannot be embedded with conventional processes that require mass solder reflow temperatures or electrolytic plating. The preferred stud bump is gold placed on an appropriate surface finish such as ENIG or ENIPEG plating used for conventional wire bonding operations.

Figure 13J:
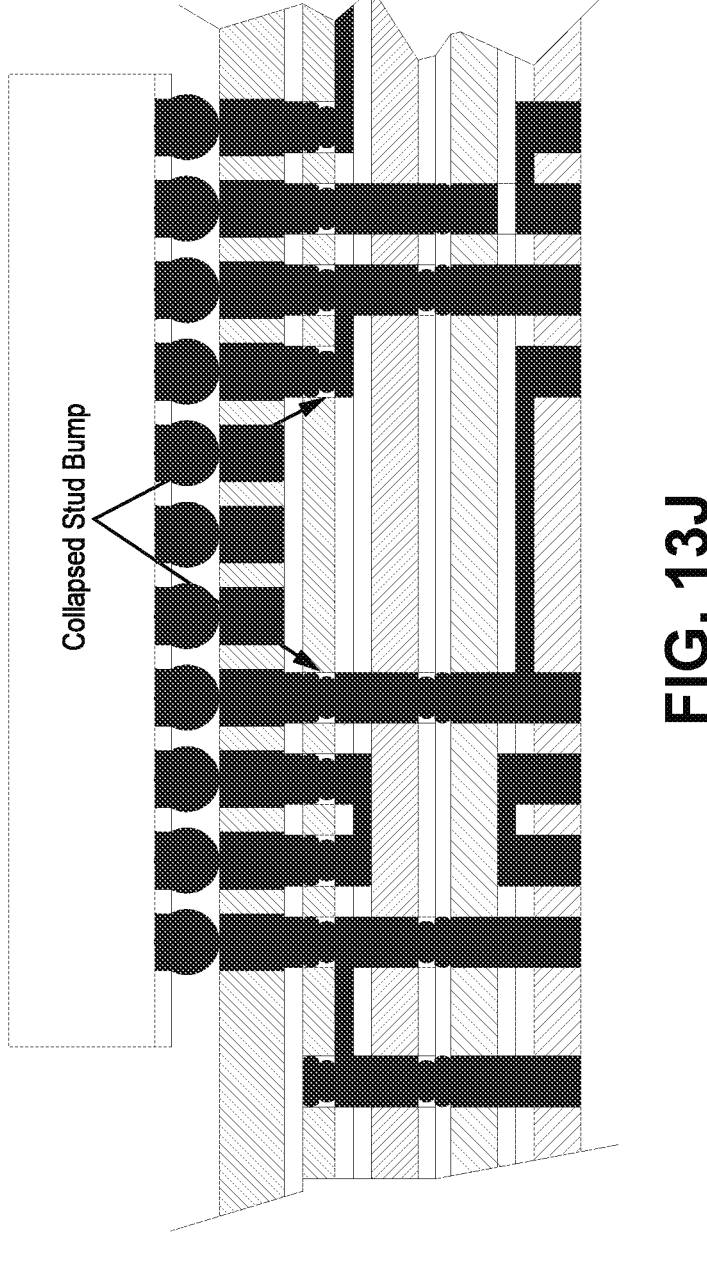
FIG. 13J is a cross-sectional view showing the circuit sub-assemblies being merged together and collapsed stud bumps.

FIG. 13J illustrates that once the circuit sub-assemblies are merged together, the stud bumps collapse as they are predominately gold which is much softer than the base copper layers or copper vias, while the bond layer is predominately a thermo set material that cures under heat and pressure if needed to maintain the integrity of the overall circuit stack mechanically as well as hold electrical connection in place to supplement the bond of stud bump to ENIPEG plated copper bump locations and opposing metallization. This process can also apply to fabrication of base circuits with no embedded components, and is particularly applicable to a rigid flex construction where rigid regions are mated with flexible members and interconnected with the stud bump interfaces.

Figure 13K:
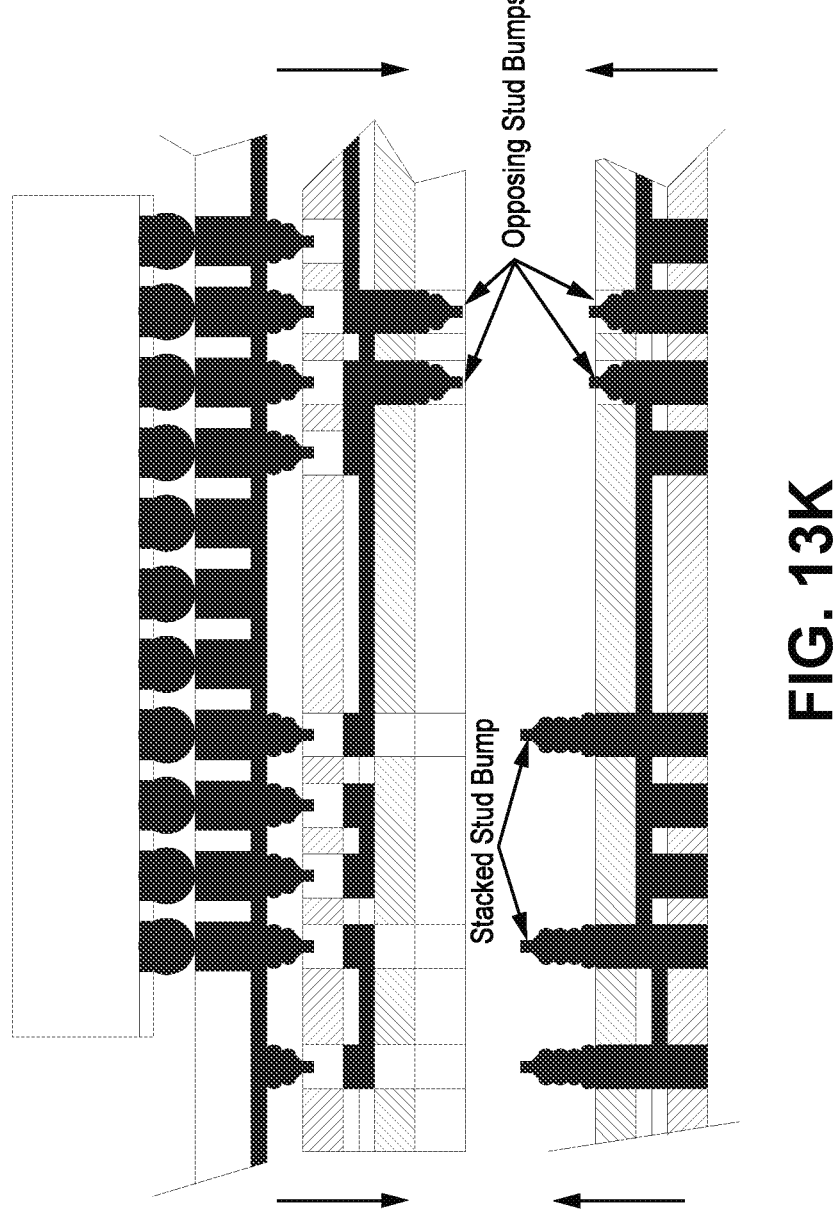
FIG. 13K is a cross-sectional view showing an example in which stud bumps are stacked on top of each other.

FIG. 13K illustrates an example in which stud bumps are stacked on top of each other to reach a higher aspect ratio or to align opposing stud bumps that collapse into each other.

Figure 13L:
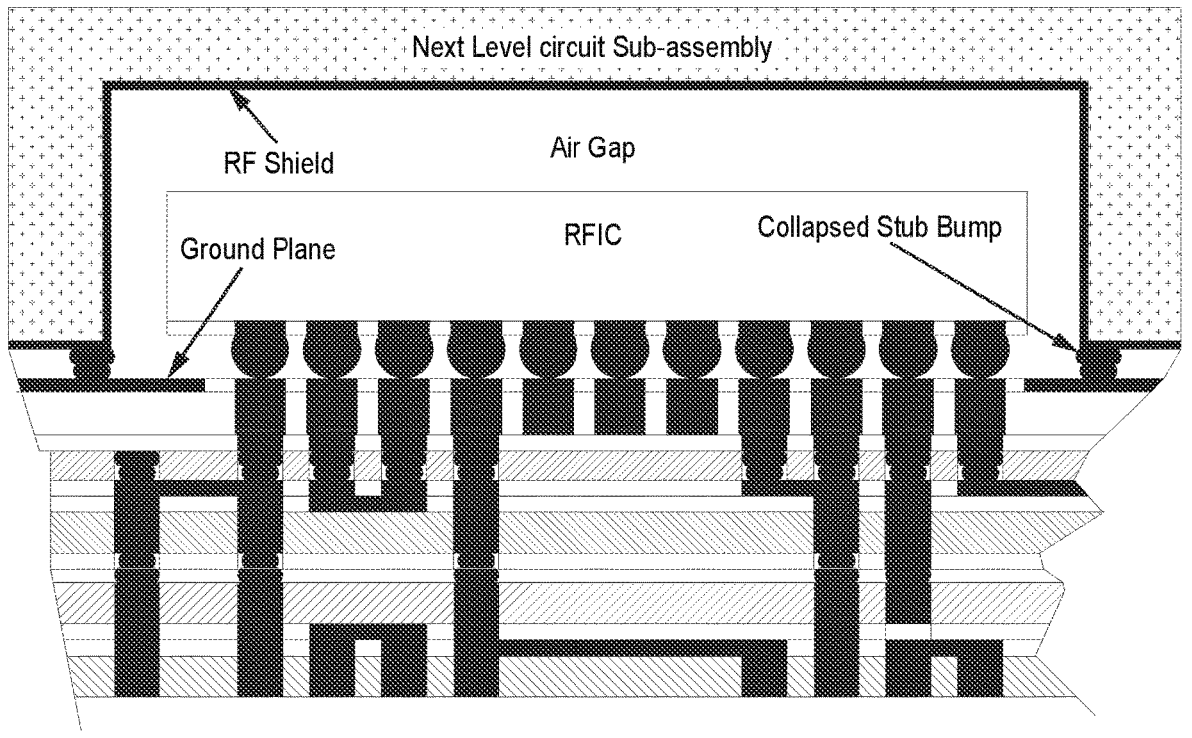
FIG. 13L is a cross-sectional view showing an example in which an air gap dielectric is defined above the device/die to improve performance, such as when the die has RF wireless circuitry.

FIG. 13L illustrates an example in which an air gap dielectric is defined above the device/die to improve performance, such as when the die has RF wireless circuitry. The air gap can provide shielding of a device or several devices within an assembly. The processes described herein enable internal features, such as air gaps, that are not possible with conventional construction methods. The processes described herein allows for merging a circuit sub-assembly that creates an air gap dielectric as well as a RF shield that is plated with electroless copper or a combination of electroless and electrolytic copper which is connected to a ground plane in a similar fashion to the gang stud bump assembly process supported by a bond layer. Such features can be formed by, for example, thermoforming the LCP material into a desired shape, then adding appropriate metal layers and circuit feature, and then mounted to a sub-assembly.

Figure 13M:
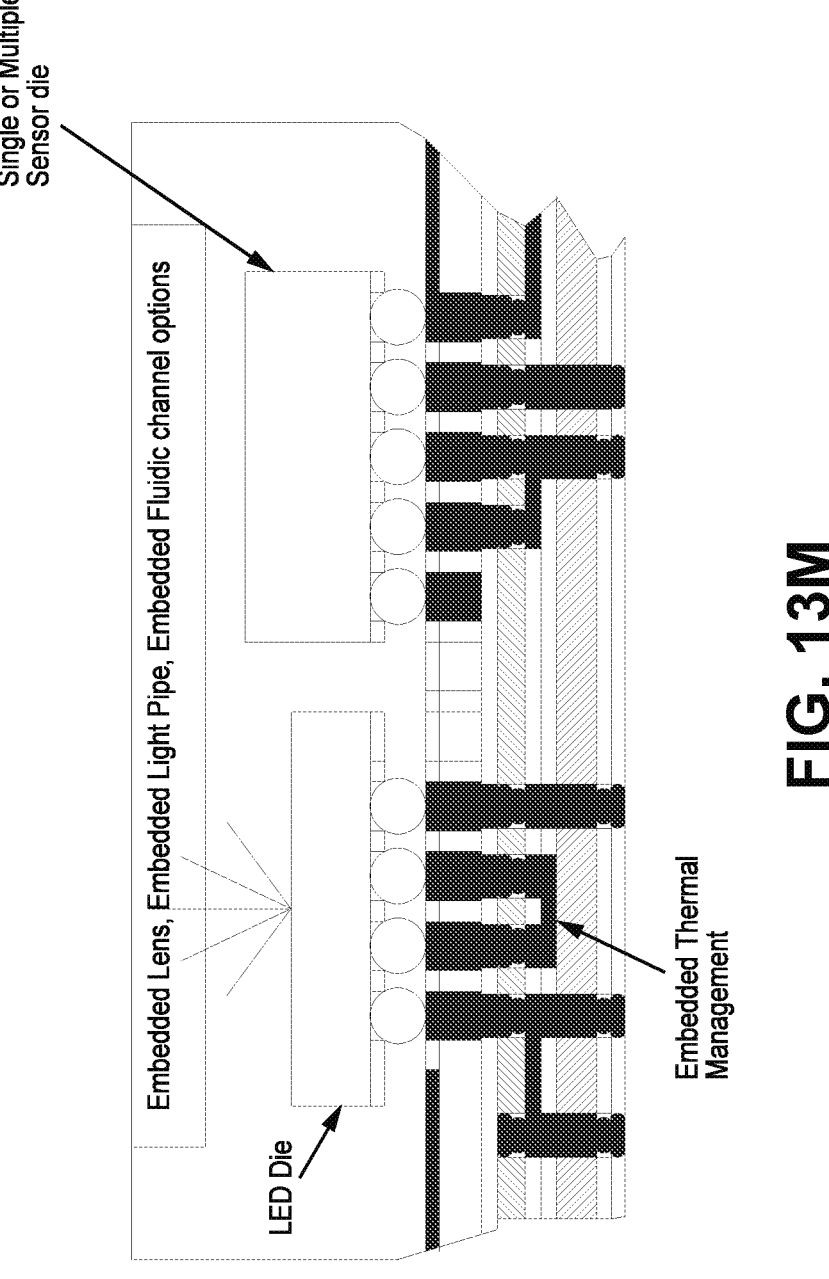
FIG. 13M is a cross-sectional view showing an example in which embedded LED devices are included for illumination or sensor integration.

FIG. 13M illustrates an example in which embedded LED devices are included for illumination or sensor integration. Many wearable medical or activity devices measure or estimate vital sign readings with the use of LED light reflected off of skin or a target with sensors that measure the desired sign indicators. In some microfluidic applications it may be desirable have near proximity illumination of isolated samples. A benefit of the technology is the devices can be embedded directly and combined with light pipes, embedded lenses, fluid channels, thermal management or sensor die.

Figure 14A:
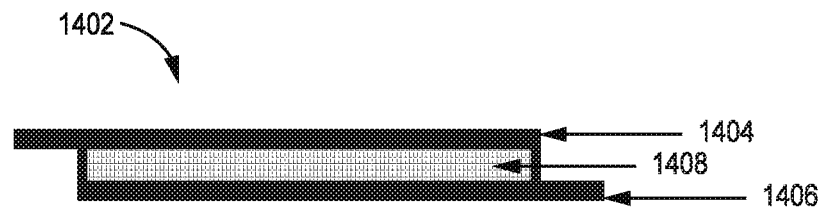
FIG. 14A is a cross-sectional view of an example capacitive device that can be integrated into LCP material.
Figure 14B:
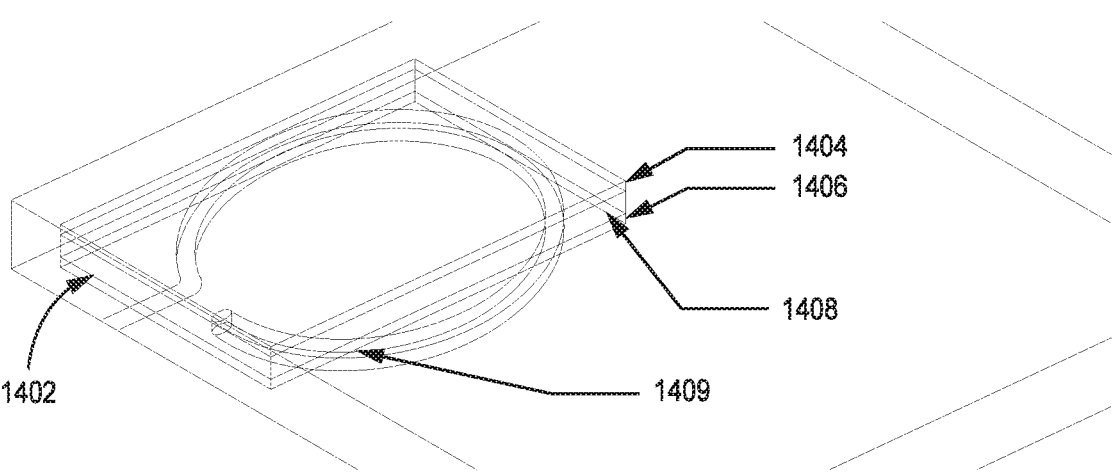
FIG. 14B is a see-through view of an example of the capacitive device having a charging coil to provide power to and potentially receive power from the capacitive device.

FIG. 14A is a cross-sectional view of an example capacitive device 1402 that can be integrated into LCP material. The nature of the LCP embedding processes described herein allows for placement of power sources, power management, power conditioning, and charging capabilities within the target end product. Most end product devices include a battery source of some kind, which is typically a discrete battery used in commercial products. These conventional batteries are used because they are low cost and readily available, but they are not optimized for the function of the target device. The embedding process allows for connection of conventional batteries, but also allows for the embedding of more sophisticated power source options such as embedded capacitance and embedded inductive charging coils and associated management devices. The capacitive device 1402 includes a first and second metal layers 1404, 1406 disposed in parallel with one another and having a dielectric material therebetween. The metal layers 1404, 1406 are connected to other portions of a circuit via traces extending therefrom. FIG. 14B is a see-through view of an example of the capacitive device 1402 having a charging coil 1409 that is disposed adjacent a longitudinal face of the capacitive device 1402 to provide power to and potentially receive power from the capacitive device 1402.

Figure 14C:
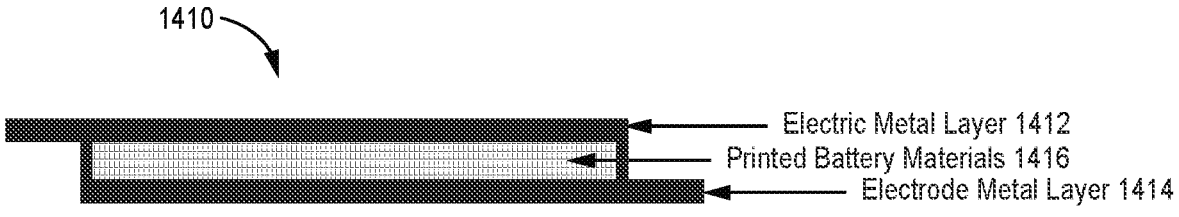
FIG. 14C is a cross-sectional view of an example battery that can be integrated into LCP material.

FIG. 14C is a cross-sectional view of an example battery 1410 that can be integrated into LCP material. Flexible printed batteries have become a growing market segment and the nature of the LCP based device enables the materials to be printed directly into the device during the assembly process and embedded as the construction is progressed or completed. The battery 1410 includes a first and second metal layers 1412, 1414 disposed in parallel with one another and having batter material printed therebetween. The metal layers 1412, 1414 are connected to other portions of a circuit via traces extending therefrom.

The construction can be created whereby the metal electrode layers or terminals are embedded directly in-line with desired power nets and into the printed battery materials with external terminals created to facilitate charge or discharge as desired.

In addition, a conventional commercial battery can be embedded, and power network or charge circuitry can be embedded in-line with the exposed terminals to eliminate the need for battery replacement.

Figure 15:
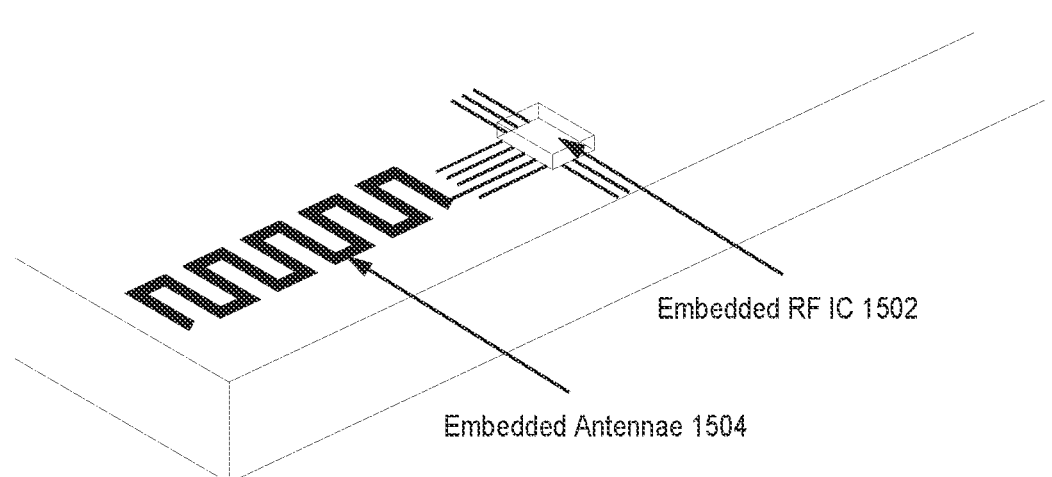
FIG. 15 is a see-through view of an embedded RF wireless component and associate antenna.

FIG. 15 is a see-through view of an embedded RF wireless component 1502 and associate antenna 1504. The embedding processes described herein are conducive to embedding RF-Wireless components and associated antenna, with the transmit/receive signal lines connected directly to the device with optimized impedance and trace geometries for maximum signal performance. The electrical properties of LCP combined with the embedded micro-circuitry enable very speed wireless and digital communications which is very unique and valuable for next generation Wi Fi or 5G communications starting at 6 GHz and progressing to 30 GHz, 39 GHz, and 60 GHz.

Figure 16A:
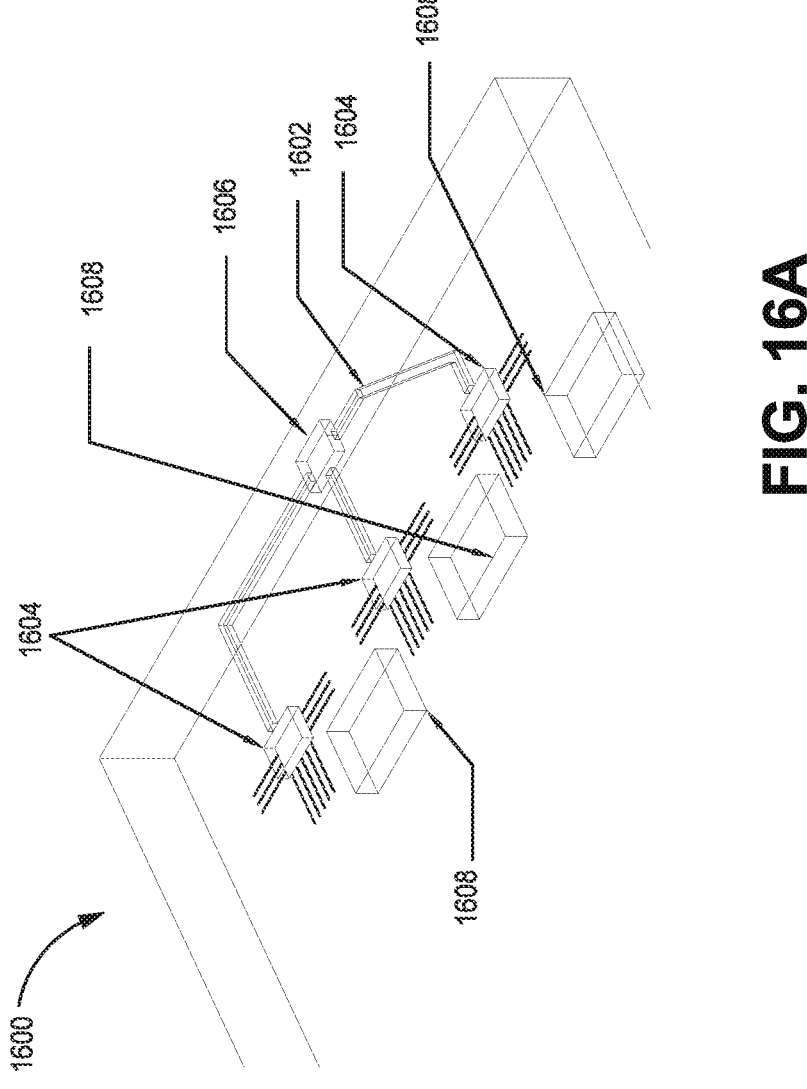
FIG. 16A is a see-through view of an example LCP structure including micro-fluidic channels, fluidic sensor devices, chambers, and other ICs that are integrated into LCP material.

FIG. 16A is a see-through view of an example LCP structure 1600 including micro-fluidic channels 1602, fluidic sensor devices 1604, chambers 1606, and other ICs 1608 that are integrated into LCP material. The processes described herein enable embedding or defining of micro-fluidic channels 1602 that align directly to the terminal locations of an embedded sensor device 1604. Many fluidic sensing applications measure the electrical impact of fluid contact with a sensor device terminal. This measurement can be accented by the ability to deliver reagents or reactants to the sensor terminal to drive a desired chemical reaction.

The nature of LCP properties being impervious to moisture creates a natural non-wetting capillary action when a sample is delivered to the exposed location for sample placement. Single or multiple sensors 1606 can be embedded to conduct a wide variety of measurements, with the option to embed vacuum chambers that can assist with drawing sample fluid to the terminals on the sensors 1606. Several types of valve structures can be micro-machined into the base LCP material to create one way or restrictive fluid movement released when desired during the measurement sequence.

Figure 16B:
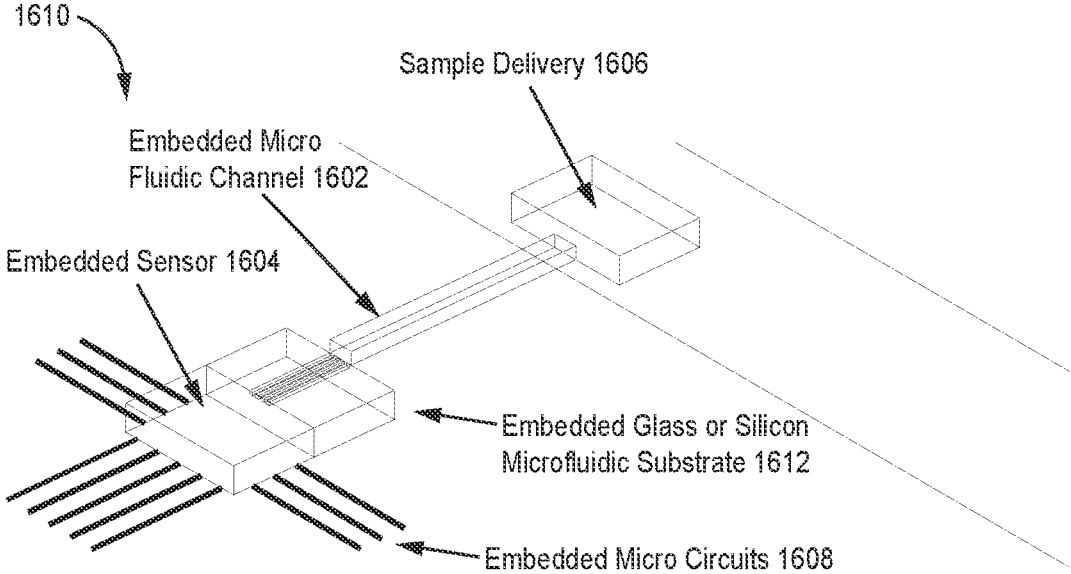
FIG. 16B is a see-through view of an example LCP structure having a silicon or glass micro-fluidic substrate with finer channels that align directly with the terminals on an embedded sensor device.

FIG. 16B is a see-through view of an example LCP structure 1610 having a silicon or glass micro-fluidic substrate 1612 with finer channels that align directly with the terminals on an embedded sensor device 1604. This mimics the conventional practice using glass or silicon as the micro-fluidic sample delivery mechanism with finer geometries than may be possible with LCP. The advantage of the process is precise alignment of the micro-channels with the sensor terminals.

Since the vast majority of diagnostic and sensor actions are electro-chemical based, the nature of the processes described herein are conducive to embedding desired materials required for a particular reaction. During the assembly process, inert chambers are embedded into the LCP device in strategic locations near the desired electro-chemical terminal locations. These chambers can be simply filled with the desired assays, liquids, gasses, solids in pure known concentrations with pressurized atmosphere or vacuum atmosphere or normal atmosphere to facilitate delivery to the desired sensor terminals or specific circuits that are used to measure the change in electro-chemical conditions pre and post reaction event. In some cases, a golden unit or known value assay can be embedded such that the sensor measures the difference between the sensor target and the known value rather than measuring actual ultimate value.

Figures 17A, 17B:
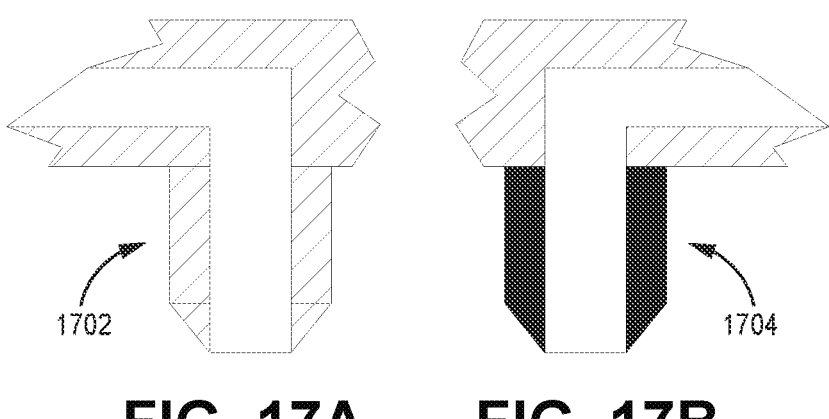
FIGS. 17A and 17B are cross-sectional views of example collection terminals for collection of a fluid.

FIGS. 17A and 17B are cross-sectional views of example collection terminals 1702, 1704 for collection of a fluid. The collection terminals 1702, 1704 project outward and define a hollow passageway within that is fluidly coupled to a micro-fluidic channel defined in the LCP material. One or more two dimensional arrays of fluid collection terminals 1702, 1704 can be created as inert LCP buttons (1702) with a through hole that connects to the fluidic channels, or can be copper based and gold plated (1704) to prevent chemical interaction with the base copper material.

FIGS. 18A-C are cross-sectional views of example electrical terminations 1802, 1804, 1806 that can facilitate electrical connection to next level assembly, or provide micro-electrodes to interface to a desired surface. For example, electrode connections to skin can be enhanced by providing a solid metal terminal that projects proud of the surface of LCP (1802). In another example, the terminal can serve dual purpose as electrode that also can collect fluid sample (1804). In yet another example, the terminal can be a mushroom style head that can serve as a surface interface or plug into a connector (1806).

FIG. 19 is a cross-sectional view of example metal portions of a plurality of micro-contacts 1808 that can be formed in LCP material. Such a micro-contact 1808 can be configured to mate with a mushroom shaped electrical terminal 1806 to provide a means of physically and electrically coupling two LCP sub-assemblies. In particular, a two-dimensional array of electrical terminals 1806 can be formed on a first sub-assembly and mated with a corresponding two-dimensional array of micro-contacts 1808 on a second sub-assembly to provide physical and electrical coupling of the first sub-assembly with the second sub-assembly without the use of heat or lamination techniques.

Each micro-contact 1808 can include a recess defined in LCP material. The recess has a width and depth that corresponds to the length and width of an electrical terminal 1808 and allows acceptance of an electrical terminal 1808 therein. The micro-contact also includes one or more arced metal arms 1810 that project into the recess at a location that is spaced-apart from a bottom of the recess. The arced metal arms 1810 are disposed within the recess such that they flex to allow passage of a head of the mushroom-shaped terminal 1806 thereby. After the head of the mushroom-shaped terminal 1806 pushes past the metal arm 1810, the arm 1810 springs back such that it would catch on the shoulder of the terminal 1808 if the terminal 1808 were pulled backwards out of the recess. In an example, the arm 1810 is disposed such that it springs back and contacts a body of the terminal 1806 to provide an electrical coupling therebetween. The arm 1810 can be coupled to circuitry within its LCP material via appropriate traces. This enables the ability to embed electrical contacts that engage with copper pillar mushroom head style terminals. The image below illustrates a high density area array contact type that is embedded as a lead-frame into the LCP assembly. Each micro-contact 1808 can be connected to an internal embedded trace with a vertical via 1811, and is designed to engage with an opposing pillar terminal 1806 which is connected to an appropriate circuit trace.

Figure 20:
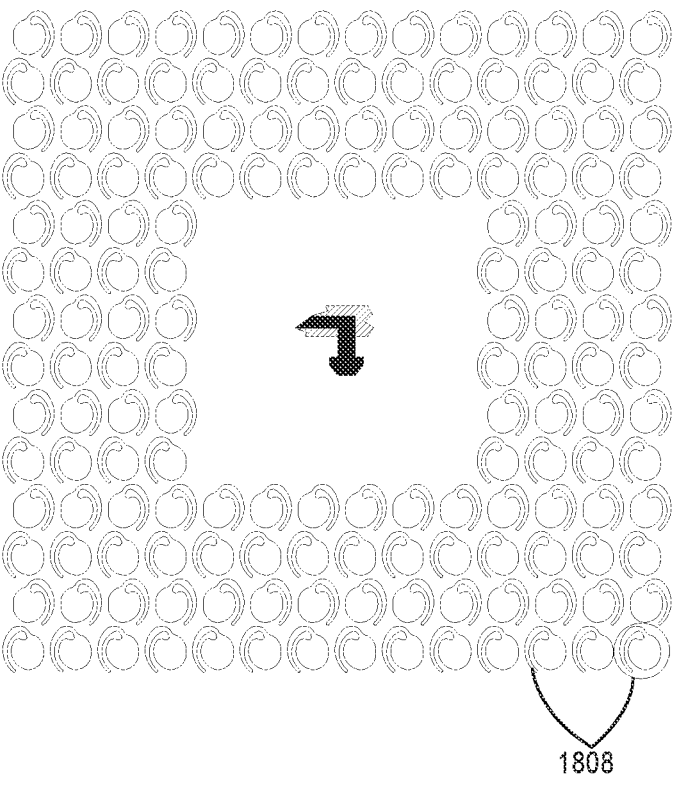
FIG. 20 is a top view of an example two-dimensional array of micro-contacts that is configured to mate with a corresponding two-dimensional array of electrical terminals.

FIG. 20 is a top view of an example two-dimensional array of micro-contacts 1808 that is configured to mate with a corresponding two-dimensional array of electrical terminals 1806. Virtually any desired pattern of electrical contacts can be embedded into the LCP device during the construction process and connected to the embedded micro-circuitry and subsequently mated with an opposing terminal. This interconnect method can be used to create electrical connection to an external instrument or next level system, or can be used to create a means to separable connect or plug sub-assemblies or modules together in unlimited combinations. These separable interconnects can be left separable if desired, or can be rendered permanent after interconnect insertion if desired.

Figures 21A, 21B:
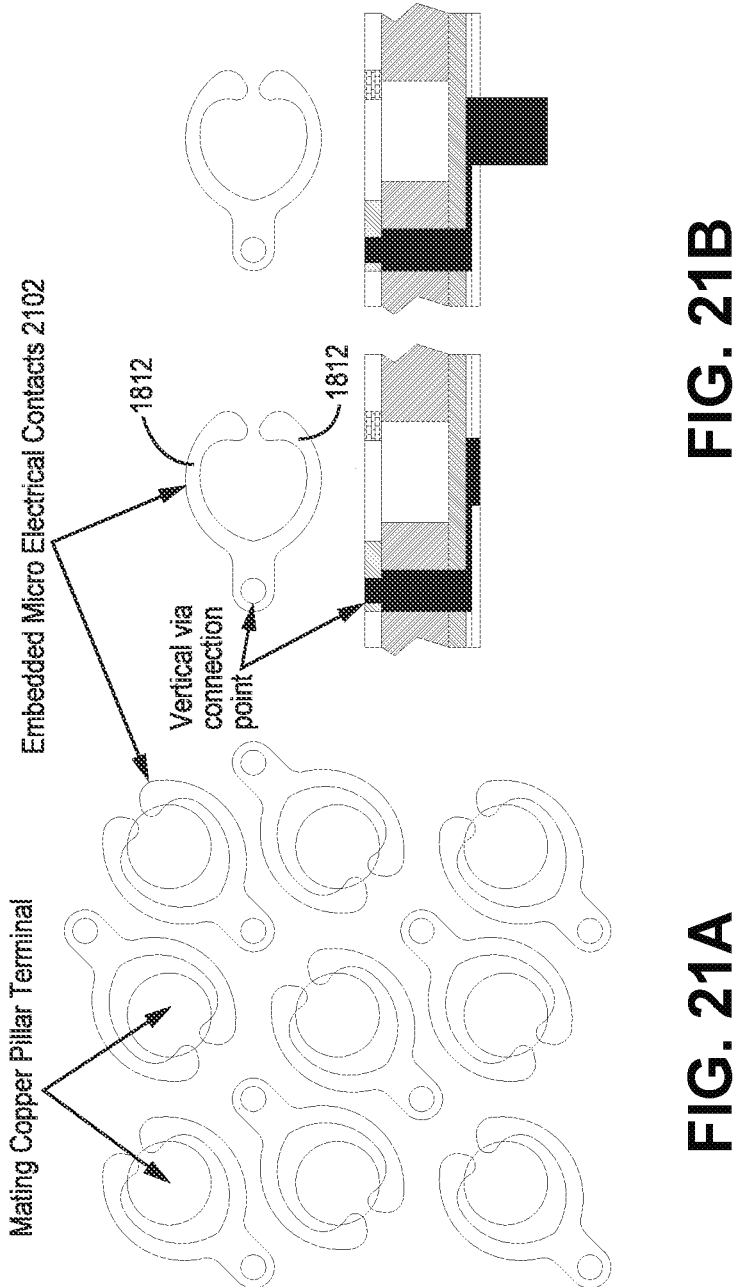
FIG. 21A-C are top views of another example micro-contact.
Figure 21C:
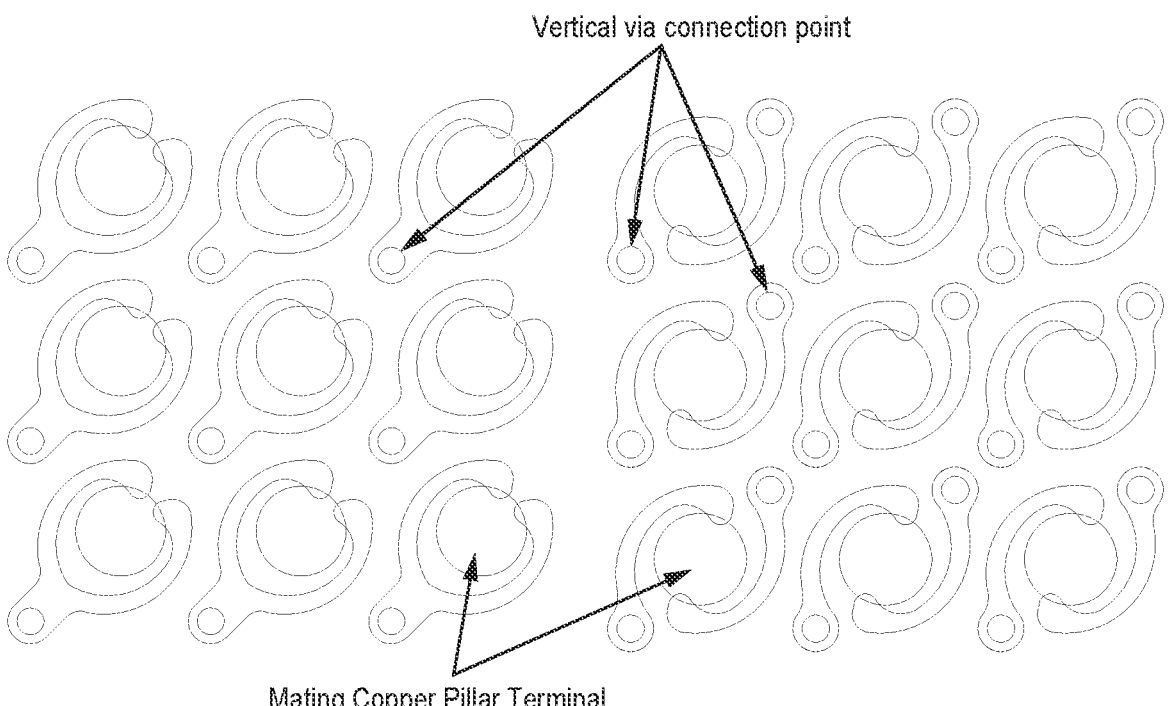
Figure 22:
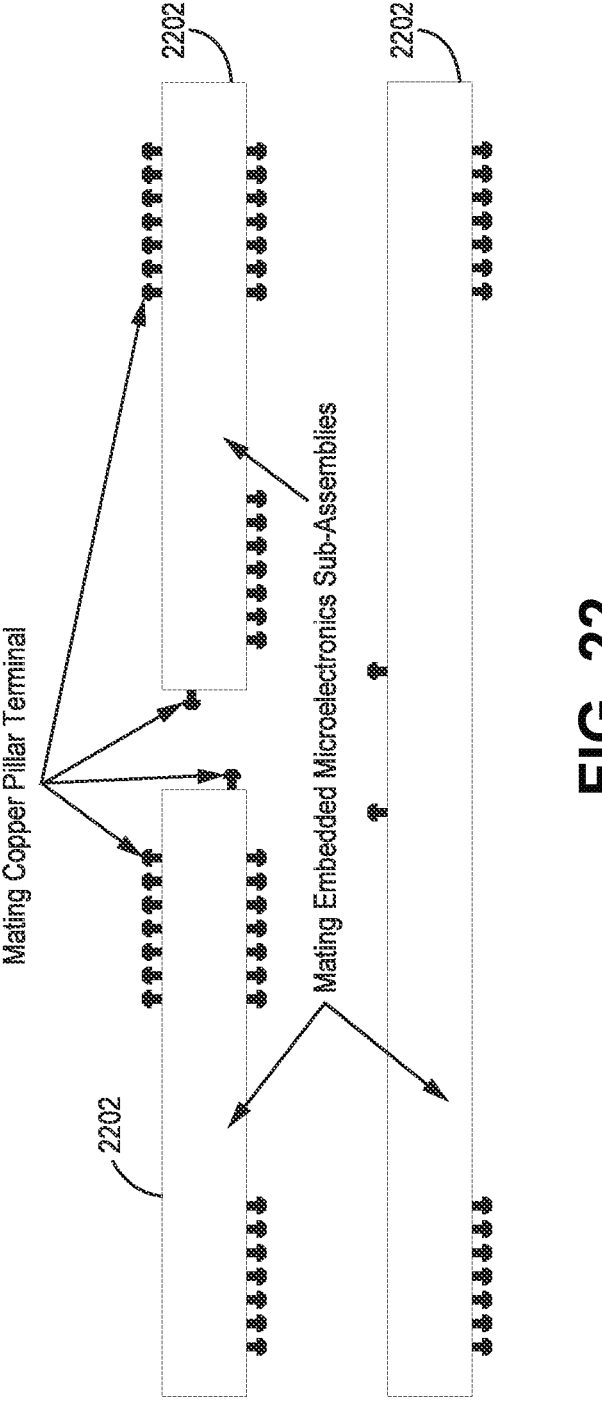
FIG. 22 is a side view of example LCP sub-assemblies having electrical terminals and corresponding micro-contacts (not shown) that can be mated to interconnect the respective sub-assemblies.

FIGS. 21A-C are top views of another example micro-contact 2102. The micro-contacts 2102 of FIGS. 21A-C can include recessed and flexible arms that function in the same manner as described with respect to FIG. 19. The micro-contacts of FIGS. 21A-C, however, include two arms 1812 that arc around opposite sides of the recesses. As such, the arms 1812 contact the electrical terminal 1806 from two sides. In general, a leadframe bearing a pattern of micro-contacts 2102 or 1808 is embedded into the LCP and connected to a vertical via or a pad where appropriate which subsequently connects to the appropriate embedded micro circuits FIG. 22 is a side view of example LCP sub-assemblies 2202 having electrical terminals and corresponding micro-contacts (not shown) that can be mated to interconnect the respective sub-assemblies. Many shapes and geometries are possible with area array connections practical in the 400 micron range possibly down to 300 micron enabling a very high density separable connection capable of very high speed interfaces. Another significant advantage is the effective functional density improvement where the embedded contacts replace what is typically a surface mounted connector with much lower density interconnect and much lower performance.

The interconnect scheme lends well to a modular approach where multiple embedded microelectronics sub-assemblies can be mated together with the copper pillar terminals and mating embedded contacts which engage with the embedded micro-circuits. This principle allows for external batteries to be plugged, or various diagnostic modules specific to a desired task can be plugged into a diagnostic module or host.

Figure 23:
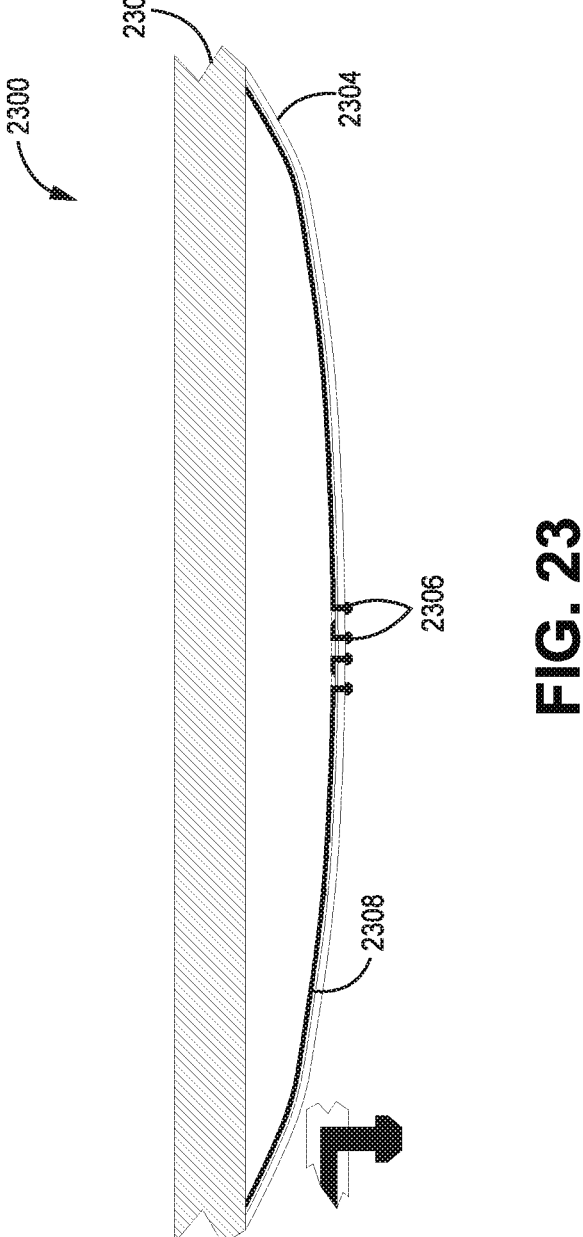
FIG. 23 is a cross-sectional view of an example bladder formed in an LCP structure.

FIG. 23 is a cross-sectional view of an example bladder 2300 formed in an LCP structure. The bladder 2300 includes a rigid structure 2302 having a thin flexible layer 2304 of LCP extending outward therefrom. The thin flexible layer 2304 can be connected to the rigid structure 2302, which can also be composed of LCP, about a perimeter and arced away from and spaced apart from the rigid structure 2302 in between the connected perimeter. This defines an air space. A plurality of electrical terminals 2306 can be defined on an outer side of the LCP member 2304. Appropriate traces 2308 can be formed through the LCP member 2304 to couple the terminals to the circuitry in the rigid structure. The flexible LCP member 2304 can provide some give allowing the electrical terminals to make good contact with, for example, a portion of a human. Such a bladder can be used in, for example, a blood pressure or atmospheric pressure measurements, the construction can be made to provide a thin layer of LCP bearing circuits and pillar terminals exposed one side, with an inflatable air bladder between the device and the exposed terminals. When inflated, the air bladder assists with applying pressure to the terminals against the desired surface such as skin or vein locations.

This pressure application method can also be embedded within the assembly and used internal to the device to provide a mechanical or pneumatic or hydraulic actuation mechanism for any desired reason or function.

Embodiments described herein can be used in a medical device and also have broad application to any micro-electronics Liquid Crystal Polymer device. Embodiments described herein provide for a Liquid Crystal Polymer Micro-Electronics device that embeds a selected feature set during the assembly and construction process such that the resultant device performs a desired function or functions of the combined features once activated or put into use.

Example processes described herein reverse the conventional construction and assembly process where the feature sets and electronic components are assembled a liquid Crystal polymer base that contains embedded micro-circuitry features as discrete devices or subassemblies and arranged into an electronic assembly that is joined electrically and mechanically during the subsequent embedding process.

Example IC embedding processed described herein can be used for conventional reflow, die attach, SMT, flipchip, wirebond etc. processing techniques, with a key advantage of the ability to assemble the components of a given architecture by joining the device terminals to the embedded circuitry terminals at the terminal during the embedding process level rather than mass assembly to a stand-alone printed circuit.

The IC embedding processes described herein allows a key aspect of providing a sacrificial test circuitry layer or layers that can be probed and activated to validate device and group of device and performance prior to final complete assembly to validate function of the actual group of devices.

The Liquid Crystal Polymer Micro Electronics devices described herein can contain a base embedded circuitry feature to serve as a base architecture platform, and assembled by embedding at least one feature of a select list of feature sets including:

Semiconductor devices, passive components, die, discrete electronics components etc.

Additional embedded micro circuitry that interconnects appropriate electronics

Sensors, RF Wireless antennae and components

Power sources, batteries, capacitive/inductive coupling, high power capacitive structures, printed batteries etc.

Microfluidic features, discrete microfluidics substrates

Sample delivery features with basic capillary or fluidic action as well as vacuum or pressure assist Embedded micro valves and fluid control and delivery features Embedded chambers containing reagents, reactants, gases, fluids, solid materials, assays, antibodies etc. with precision control of material type, quantity, location relative to sensor locations or terminals.

Embedded pressure application or actuation mechanisms

Embedded micro-contacts for electrical interconnection internal to the device or external to the device Embedded sample collection terminals or electrodes that mate with an internal or external source or interface Embedded optical features that allow control and access to external or internal or external light sources.

What is claimed is:

1. A method of embedding an integrated circuit in liquid crystal polymer (LCP) material, the method comprising:

fabricating an interposer composed of LCP material with a plurality of copper vias therein;

disposing the interposer to oppose a plurality of bond pads on the integrated circuit; bringing a first exposed side of the plurality of copper vias into contact with a corresponding plurality of metal bumps on the plurality of bond pads of the integrated circuit;

heating a second exposed side of the plurality of copper vias with a laser while the first exposed side of the plurality of copper vias is in contact with the plurality of metal bumps to reflow the solder bumps and bond the LCP layer to the integrated circuit, wherein the second exposed side of the plurality of copper vias is opposite the first exposed side of the plurality of copper vias.

2. The method of claim 1, comprising:

overmolding additional LCP material onto the interposer with circuit traces integrated therein to form an LCP structure with the integrated circuit embedded therein, wherein the circuit traces are coupled to the plurality of copper vias.

3. The method of claim 1, wherein the interposer is a planar member of LCP material wherein the LCP material is less than 100 microns thick.

4. The method of claim 1, wherein the plurality of copper vias in the interposer are one of:

a copper via flush with both surfaces of adjacent LCP material;

a copper via wherein the second exposed side is flush with an adjacent surface of LCP material and the first exposed side projects outward from the adjacent surface of the LCP material to form a copper pillar at the first exposed side;

a copper via comprising a copper plated through hole forming an annular ring with a thin layer of copper proximate a first surface of the interposer, wherein the first surface of the interposer is disposed to face away from the plurality of solder bumps during contact;

a copper via comprising a copper plated open blind via, wherein an opening defining in the open blind via is disposed to face towards the plurality of solder bumps during contact;

a copper via comprising a copper plated through hole forming an annular ring of copper with solder paste inside the annular ring; or a copper via comprising a copper plated open blind via with sinter material in an opening defined in the blind via.

5. The method of claim 1, wherein the integrated circuit is one of a packaged IC or a bare die.

6. The method of claim 1, wherein the plurality of metal bumps are one of a solder bump, a gold stud bump, or a copper stud bump.

7. A method of embedding an integrated circuit in liquid crystal polymer (LCP) material, the method comprising:

fabricating an interposer composed of LCP material with a plurality of copper vias therein, the plurality of copper vias comprising one of:

a copper via comprising a copper plated through hole forming an annular ring with a thin layer of copper proximate a first surface of the interposer, wherein the first surface of the interposer is disposed to face away from the plurality of solder bumps during contact;

a copper via comprising a copper plated open blind via, wherein an opening defining in the open blind via is disposed to face towards the plurality of solder bumps during contact;

disposing the interposer to oppose a plurality of bond pads on the integrated circuit;

bringing a first exposed side of the plurality of copper vias into contact with a corresponding plurality of copper stud bumps on the plurality of bond pads of the integrated circuit, wherein the first exposed side is an open side of annular ring or blind via;

crimping the interposer onto the integrated circuit to fuse the plurality of copper vias with the copper stud bumps.

8. The method of claim 7, comprising:

overmolding additional LCP material onto the interposer with circuit traces integrated therein to form an LCP structure with the integrated circuit embedded therein, wherein the circuit traces are coupled to the plurality of copper vias.

9. The method of claim 7, wherein the interposer is a planar member of LCP material wherein the LCP material is less than 100 microns thick.

10. The method of claim 7, wherein the integrated circuit is one of a packaged IC or a bare die.

* * * * *